United States Patent
Lee et al.

(10) Patent No.: US 12,218,297 B2
(45) Date of Patent: Feb. 4, 2025

(54) DISPLAY DEVICE

(71) Applicant: Samsung Display Co., LTD., Yongin-si (KR)

(72) Inventors: Jeong Hyun Lee, Anyang-si (KR); Jang Soon Park, Anyang-si (KR); Sung Geun Bae, Hwaseong-si (KR); Da Sol Jeong, Seoul (KR); Won Hyeong Heo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 472 days.

(21) Appl. No.: 17/719,149

(22) Filed: Apr. 12, 2022

(65) Prior Publication Data
US 2022/0393084 A1    Dec. 8, 2022

(30) Foreign Application Priority Data

Jun. 4, 2021 (KR) .......................... 10-2021-0072666

(51) Int. Cl.
*H01L 33/00* (2010.01)
*H01L 33/38* (2010.01)
*H01L 33/62* (2010.01)

(52) U.S. Cl.
CPC ............ *H01L 33/62* (2013.01); *H01L 33/382* (2013.01)

(58) Field of Classification Search
None
See application file for complete search history.

(56) References Cited

U.S. PATENT DOCUMENTS

| | | | |
|---|---|---|---|
| 11,621,312 B2 * | 4/2023 | Lim | H01L 27/124 257/40 |
| 2011/0220930 A1 * | 9/2011 | Huang | H01L 33/22 257/E33.074 |
| 2013/0016077 A1 * | 1/2013 | Lin | G02F 1/136227 257/E33.012 |
| 2014/0091280 A1 * | 4/2014 | Sun | H01L 29/78606 257/29 |
| 2015/0303225 A1 * | 10/2015 | Jiang | H01L 29/66765 438/158 |
| 2016/0307930 A1 * | 10/2016 | Liu | H01L 27/1288 |
| 2021/0336108 A1 | 10/2021 | Lee et al. | |
| 2022/0271021 A1 * | 8/2022 | Lee | H01L 33/62 |
| 2023/0030101 A1 * | 2/2023 | Bae | H01L 25/167 |

FOREIGN PATENT DOCUMENTS

KR    10-2020-0034896 A    4/2020

* cited by examiner

*Primary Examiner* — Nicholas J Tobergte
(74) *Attorney, Agent, or Firm* — Lewis Roca Rothgerber Christie LLP

(57) ABSTRACT

Provided is a display device comprising a substrate, a first active layer on the substrate and extending along a first direction, and a first conductive layer between the substrate and the first active layer, and including a first conductive pattern and a second conductive pattern spaced apart from each other in the first direction, wherein the first active layer conformally reflects a step difference of the first conductive layer, and includes a branched structure in a space between the first conductive pattern and the second conductive pattern.

20 Claims, 14 Drawing Sheets

DISPLAY DEVICE

CROSS-REFERENCE TO RELATED APPLICATION

This application claims priority to, and the benefit of, Korean Patent Application No. 10-2021-0072666, filed on Jun. 4, 2021, in the Korean Intellectual Property Office, the disclosure of which is incorporated herein in its entirety by reference.

BACKGROUND

1. Field

The present disclosure relates to a display device.

2. Description of the Related Art

Display devices are becoming increasingly important with the development of multimedia. Accordingly, various types of display devices such as organic light emitting displays and liquid crystal displays are being used.

A display device includes a display panel, such as an organic light emitting display panel or a liquid crystal display panel, as a device for displaying an image of the display device. Among them, a light emitting display panel may include light emitting elements, such as light emitting diodes (LEDs). For example, the LEDs may be organic light emitting diodes (OLEDs) using an organic material as a fluorescent material, or may be inorganic LEDs using an inorganic material as a fluorescent material.

Inorganic LEDs using an inorganic semiconductor as a fluorescent material are durable even in a high-temperature environment, and have higher blue light efficiency than OLEDs. In addition, a transfer method using dielectrophoresis (DEP) has been developed for a manufacturing process which has been pointed out as a limitation of conventional inorganic LEDs. Therefore, research is being continuously conducted on inorganic LEDs having better durability and efficiency than OLEDs.

SUMMARY

Aspects of the present disclosure provide a display device in which a likelihood of a first active layer being opened due to a step difference under the first active layer is reduced or prevented.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of the present disclosure, there is provided a display device including a substrate, a first active layer on the substrate and extending along a first direction, and a first conductive layer between the substrate and the first active layer, and including a first conductive pattern and a second conductive pattern spaced apart from each other in the first direction, wherein the first active layer conformally reflects a step difference of the first conductive layer, and includes a branched structure in a space between the first conductive pattern and the second conductive pattern.

The first active layer may include a first branch part and a second branch part spaced apart from each other in a second direction that crosses the first direction, and extending along the first direction, and a stem part connected to the first branch part and the second branch part.

The first branch part and the second branch part may branch from the stem part.

The first branch part and the second branch part may overlap the space between the first conductive pattern and the second conductive pattern.

The first branch part and the second branch part may extend from the first conductive pattern to the second conductive pattern.

The first conductive pattern may include a first voltage wiring, wherein the second conductive pattern includes a lower capacitive electrode.

The display device may further include a second conductive layer on the first active layer, and including a first gate electrode of a first transistor overlapping the stem part.

The display device may further include a third conductive layer on the second conductive layer, the third conductive layer including an end of the first branch part, an end of the second branch part, a first electrode pattern overlapping a space between the first branch part and the second branch part, and a second electrode pattern overlapping the stem part.

The first electrode pattern may overlap the first conductive pattern, wherein the second electrode pattern overlaps the second conductive pattern.

The display device may further include a buffer layer between the first conductive layer and the first active layer, a first gate insulating layer between the first active layer and the second conductive layer, and a first protective layer between the second conductive layer and the third conductive layer.

The first electrode pattern may be electrically connected to the first branch part through a (1a)-th contact hole penetrating the first protective layer and the first gate insulating layer, and is electrically connected to the second branch part through a (1b)-th contact hole penetrating the first protective layer and the first gate insulating layer.

The second electrode pattern may be electrically connected to the stem part through a second contact hole penetrating the first protective layer and the first gate insulating layer.

The first electrode pattern may include a first drain electrode of the first transistor, wherein the second electrode pattern includes a first source electrode of the first transistor.

The first conductive layer may have a thickness of about 7000 Å to about 9000 Å.

The first conductive layer may include a stacked layer of titanium (Ti) and copper (Cu).

According to another aspect of the present disclosure, there is provided a display device including a substrate, a first active layer on the substrate, and extending along a first direction, and a first conductive layer between the substrate and the first active layer, and including a first conductive pattern and a second conductive pattern spaced apart from each other in the first direction, wherein the first active layer conformally reflects a step difference of the first conductive layer, includes a branched structure in a space between the first conductive pattern and the second conductive pattern, the branched structure including a first branch part and a second branch part spaced apart from each other in a second direction crossing the first direction and extending along the first direction, and a stem part connected to the first branch part and the second branch part, wherein the first branch part and the second branch part branch from the stem part, and wherein any one of the first branch part and the second branch part includes physically separated branch patterns.

The first branch part and the second branch part may overlap the space between the first conductive pattern and the second conductive pattern.

The first branch part and the second branch part may extend from the first conductive pattern to the second conductive pattern.

The first conductive layer may have a thickness of 7000 to 9000 Å.

The first conductive layer may include a stacked layer of titanium (Ti) and copper (Cu).

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
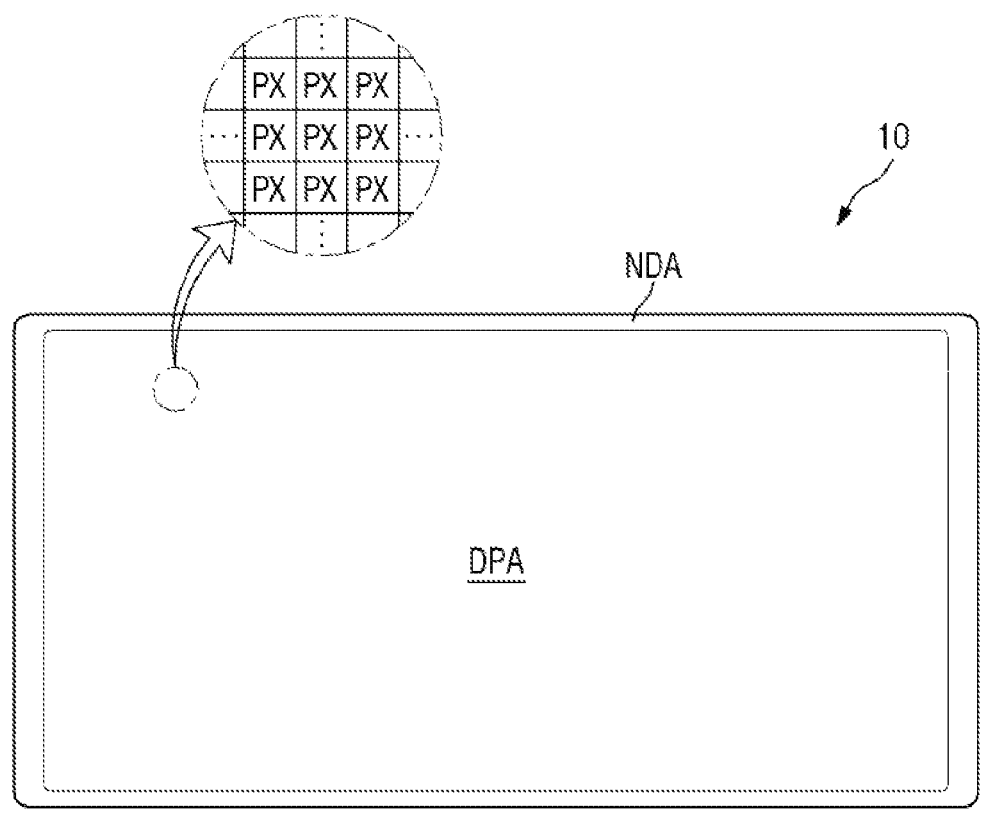
FIG. 1 is a schematic plan view of a display device according to one or more embodiments.
Figure 1:
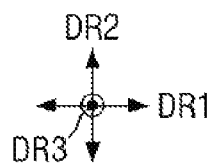

Specific structural and functional descriptions of embodiments of the present disclosure disclosed herein are only for illustrative purposes of the embodiments of the present disclosure. The disclosed embodiments may be embodied in many different forms without departing from the spirit and significant characteristics of the present disclosure. Therefore, the embodiments of the present disclosure are disclosed only for illustrative purposes and should not be construed as limiting the present disclosure. That is, the present disclosure is only defined by the scope of the claims and their functional equivalents.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the present disclosure will be described with reference to the attached drawings.

FIG. 1 is a schematic plan view of a display device 10 according to one or more embodiments.

In the present specification, "above," "top," and "upper surface" indicate an upward direction from the display device 10, that is, a direction of a third direction DR3, and "under," "bottom," and "lower surface" indicate the other direction of the third direction DR3. In addition, "left," "right," "upper," and "lower" indicate directions when the display device 10 is seen in plan view. For example, "left" indicates a direction of a first direction DR1, "right" indicates the other direction of the first direction DR1, "upper" indicates a direction of a second direction DR2, and "lower" indicates the other direction of the second direction DR2.

Referring to FIG. 1, the display device 10 displays moving images or still images. The display device 10 may refer to any electronic device that provides a display screen. Examples of the display device 10 may include televisions, notebook computers, monitors, billboards, the Internet of things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras and camcorders, all of which provide a display screen.

The display device 10 includes a display panel that provides a display screen. Examples of the display panel include inorganic light emitting diode display panels, organic light emitting display panels, quantum dot light emitting display panels, plasma display panels, and field emission display panels. A case where an inorganic light emitting diode display panel is applied as an example of the display panel will be described below, but the present disclosure is not limited to this case, and other display panels can also be applied.

The shape of the display device 10 can be variously modified. For example, the display device 10 may have various shapes, such as a horizontally long rectangle, a vertically long rectangle, a square, a quadrangle with rounded corners (vertices), other polygons, and a circle. The shape of a display area DPA of the display device 10 may also be similar to the overall shape of the display device 10. In FIG. 1, each of the display device 10 and the display area DPA is shaped like a horizontally long rectangle.

The display device 10 may include the display area DPA and a non-display area NDA. The display area DPA may be an area where a screen can be displayed, and the non-display area NDA may be an area where no screen is displayed. The display area DPA may also be referred to as an active area, and the non-display area NDA may also be referred to as an inactive area. The display area DPA may generally occupy the center of the display device 10.

The display area DPA may include a plurality of pixels PX. The pixels PX may be arranged in a matrix direction. Each of the pixels PX may be rectangular or square in plan view. However, the present disclosure is not limited thereto, and each of the pixels PX may also have a rhombic planar shape having each side inclined with respect to a direction. The pixels PX may be alternately arranged in a stripe or PenTile/PENTILE® type (e.g., a PENTILE® matrix structure or an RGBG structure (e.g., a PENTILE® structure)). PENTILE® is a registered trademark of Samsung Display Co., Ltd., Republic of Korea. In addition, each of the pixels PX may include one or more light emitting elements 30 which emit light of a corresponding wavelength band to display a corresponding color.

The non-display area NDA may be located around the display area DPA. The non-display area NDA may entirely or partially surround the display area DPA. The display area DPA may be rectangular, and the non-display area NDA may be located adjacent to four sides of the display area DPA. The non-display area NDA may form a bezel of the display device 10. In each non-display area NDA, wirings or circuit drivers included in the display device 10 may be located, or external devices may be mounted.

Figure 2:
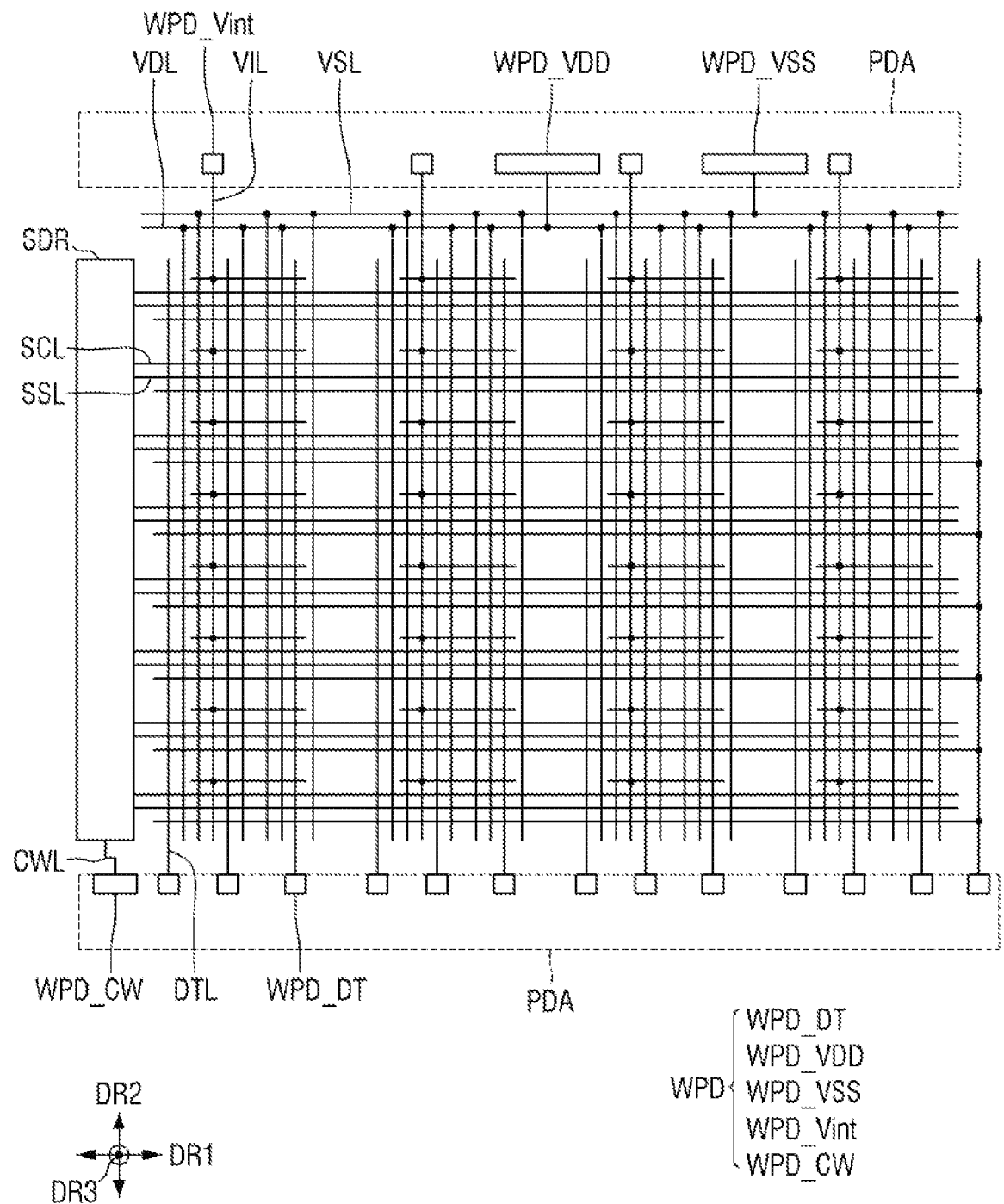
FIG. 2 is a schematic layout view of wirings included in the display device according to one or more embodiments.

FIG. 2 is a schematic layout view of wirings included in the display device 10 according to one or more embodiments.

Referring to FIG. 2, the display device 10 may include a plurality of wirings. The wirings may include scan lines SCL, sensing lines SSL, data lines DTL, initialization voltage wirings VIL, a first voltage wiring VDL, and a second voltage wiring VSL. In addition, other wirings may be further located in the display device 10 in other embodiments.

The scan lines SCL and the sensing lines SSL may extend in the first direction DR1. The scan lines SCL and the sensing lines SSL may be connected to a scan driver SDR. The scan driver SDR may include a driving circuit. The scan driver SDR may be located on a side of the display area DPA in the first direction DR1, but the present disclosure is not limited thereto. The scan driver SDR may be connected to a signal connection wiring CWL, and at least one end of the signal connection wiring CWL may form a pad WPD_CW in the non-display area NDA, and thus may be connected to an external device.

In the present specification, the term "connect" may mean that any one member and another member are connected to each other not only through physical contact but also through another member. In addition, it can be understood that any one part and another part are connected to each other as one integrated member. Further, the connection between any one member and another member can be interpreted to include electrical connection through another member in addition to connection through direct contact.

The data lines DTL and the initialization voltage wirings VIL may extend in the second direction DR2 intersecting the first direction DR1. Each of the initialization voltage wirings VIL may include a part extending in the second direction DR2 and parts branching therefrom in the first direction DR1. Each of the first voltage wiring VDL and the second voltage wiring VSL may also include parts extending in the second direction DR2, and a part connected thereto and extending in the first direction DR1. The first voltage wiring VDL and the second voltage wiring VSL may have a mesh structure, but the present disclosure is not limited thereto. In other embodiments, each pixel PX of the display device 10 may be connected to at least one data line DTL, an initialization voltage wiring VIL, the first voltage wiring VDL, and the second voltage wiring VSL.

The data lines DTL, the initialization voltage wirings VIL, the first voltage wiring VDL, and the second voltage wiring VSL may be electrically connected to at least one wiring pad WPD. Each wiring pad WPD may be located in the non-display area NDA. In some embodiments, wiring pads WPD_DT of the data lines DTL (hereinafter, referred to as data pads) may be located in a pad area PDA on a side of the display area DPA in the second direction DR2, and wiring pads WPD_Vint of the initialization voltage wirings VIL (hereinafter, referred to as initialization voltage pads), a wiring pad WPD_VDD of the first voltage wiring VDL (hereinafter, referred to as a first power pad), and a wiring pad WPD_VSS of the second voltage wiring VSL (hereinafter, referred to as a second power pad) may be located in a pad area PDA located on the other side of the display area DPA in the second direction DR2.

For another example, in other embodiments, the data pads WPD_DT, the initialization voltage pads WPD_Vint, the first power pad WPD_VDD, and the second power pad WPD_VSS may all be located in the same area, for example, in the non-display area NDA located on an upper side of the display area DPA. An external device may be mounted on the wiring pads WPD. The external device may be mounted on the wiring pads WPD through an anisotropic conductive film, ultrasonic bonding, or the like.

Each pixel PX or subpixel PXn (where n is an integer of 1 to 3) of the display device 10 includes a pixel driving circuit. The above-described wirings may transmit a driving signal to each pixel driving circuit while passing through or around each pixel PX. The pixel driving circuit may include a transistor and a capacitor. The number of transistors and capacitors in each pixel driving circuit can be variously changed. According to some embodiments, each subpixel PXn of the display device 10 may have a 3T1C structure in which the pixel driving circuit includes three transistors and one capacitor. Although the pixel driving circuit will be described below using the 3T1C structure as an example, the present disclosure is not limited thereto, and other various modified pixel structures, such as a 2T1C structure, a 4T1C structure, and a 7T1C structure, are also applicable.

Figure 3:
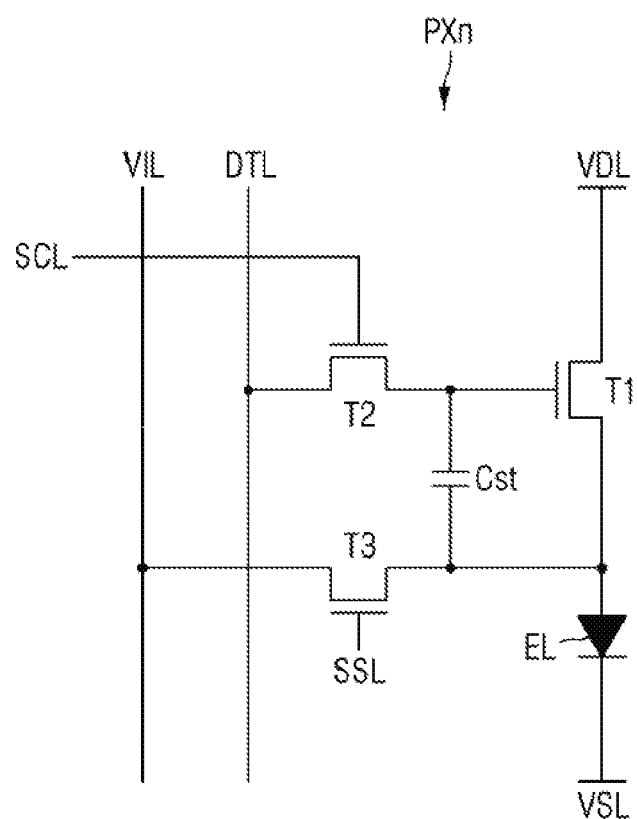
FIG. 3 is an equivalent circuit diagram of a subpixel according to one or more embodiments.

FIG. 3 is an equivalent circuit diagram of a subpixel PXn according to one or more embodiments.

Referring to FIG. 3, each subpixel PXn of the display device 10 according to one or more embodiments includes three transistors T1 through T3 and one storage capacitor Cst in addition to a light emitting diode EL.

The light emitting diode EL emits light according to a current supplied through a first transistor T1. The light emitting diode EL includes a first electrode, a second electrode, and at least one light emitting element located between them. The light emitting element may emit light of a corresponding wavelength band in response to an electrical signal received from the first electrode and the second electrode.

A first end of the light emitting diode EL may be connected to a source electrode of the first transistor T1, and a second end of the light emitting diode EL may be connected to a second voltage wiring VSL to which a low potential voltage (hereinafter, referred to as a second power supply voltage), which is lower than a high potential voltage (hereinafter, referred to as a first power supply voltage), is supplied.

The first transistor T1 adjusts a current flowing from a first voltage wiring VDL, to which the first power supply voltage is supplied, to the light emitting diode EL according to a voltage difference between a gate electrode and the source electrode. For example, the first transistor T1 may be a driving transistor for driving the light emitting diode EL. The first transistor T1 may have the gate electrode connected to a source electrode of the second transistor T2, the source electrode connected to the first electrode of the light emitting diode EL, and a drain electrode connected to the first voltage wiring VDL to which the first power supply voltage is applied.

The second transistor T2 is turned on by a scan signal of a scan line SCL to connect a data line DTL to the gate electrode of the first transistor T1. The second transistor T2 may have a gate electrode connected to the scan line SCL, the source electrode connected to the gate electrode of the first transistor T1, and a drain electrode connected to the data line DTL.

A third transistor T3 is turned on by a sensing signal of a sensing line SSL to connect an initialization voltage wiring VIL to the first end of the light emitting diode EL. The third transistor T3 may have a gate electrode connected to the sensing line SSL, a drain electrode connected to the initialization voltage wiring VIL, and a source electrode connected to the first end of the light emitting diode EL or the source electrode of the first transistor T1.

In some embodiments, the source electrode and the drain electrode of each of the transistors T1 through T3 are not limited to the above description, and the opposite may also be the case in some embodiments.

The storage capacitor Cst is formed between the gate electrode and the source electrode of the first transistor T1. The storage capacitor Cst stores a difference between a gate voltage and a source voltage of the first transistor T1.

Each of the transistors T1 through T3 may be formed as a thin-film transistor. In addition, although each of the transistors T1 through T3 is mainly described as an N-type metal oxide semiconductor field effect transistor (MOSFET) in FIG. 3, the present disclosure is not limited thereto. That is, in other embodiments, each of the transistors T1 through T3 may also be formed as a P-type MOSFET, or some of the transistors T1 through T3 may be formed as N-type MOSFETs, and the other may be formed as a P-type MOSFET.

The structure of a pixel PX of the display device 10 according to one or more embodiments will now be described in detail by further referring to other drawings.

Figure 4:
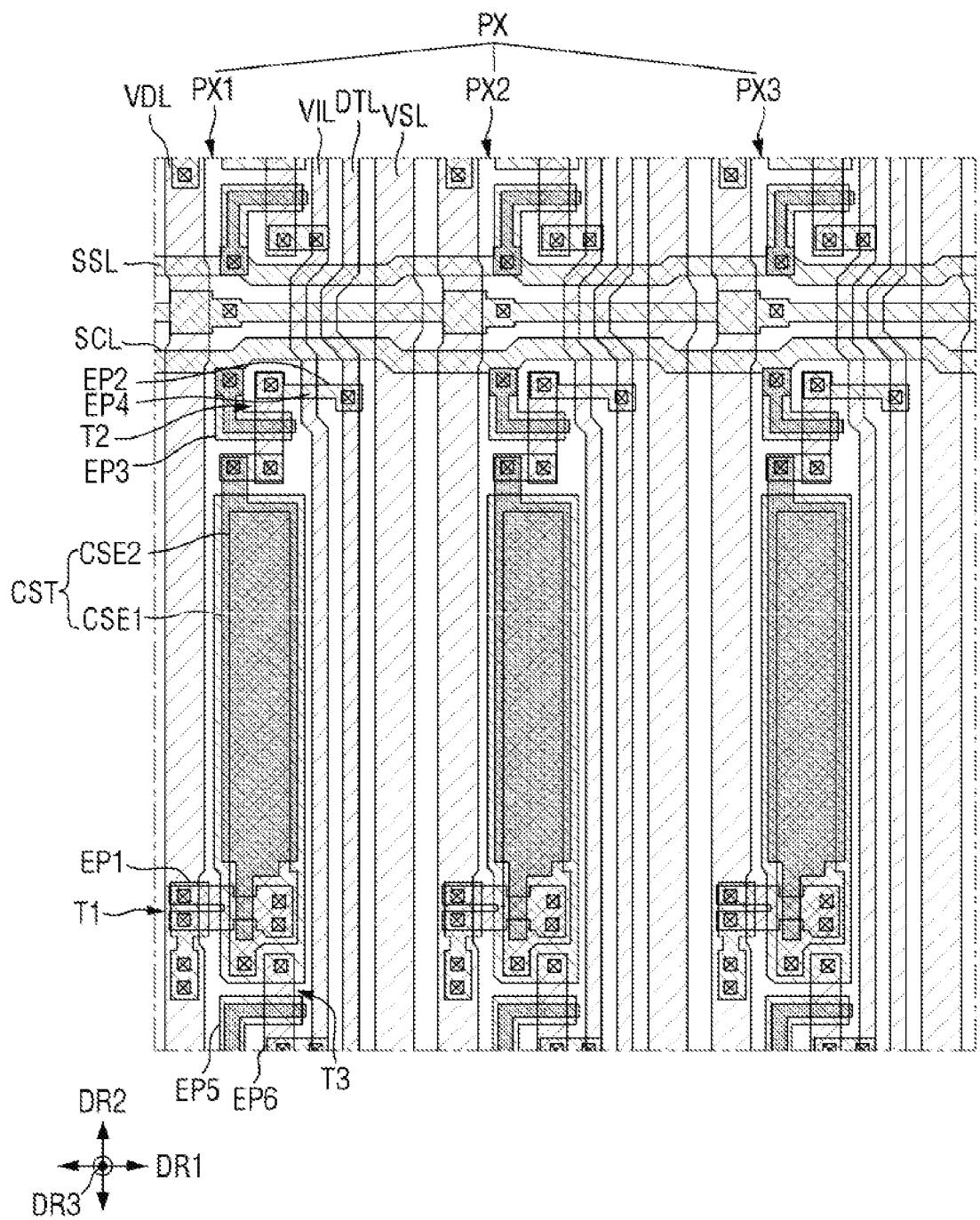
FIG. 4 is a layout view illustrating a plurality of conductive layers included in a subpixel of the display device according to one or more embodiments.
Figure 5:
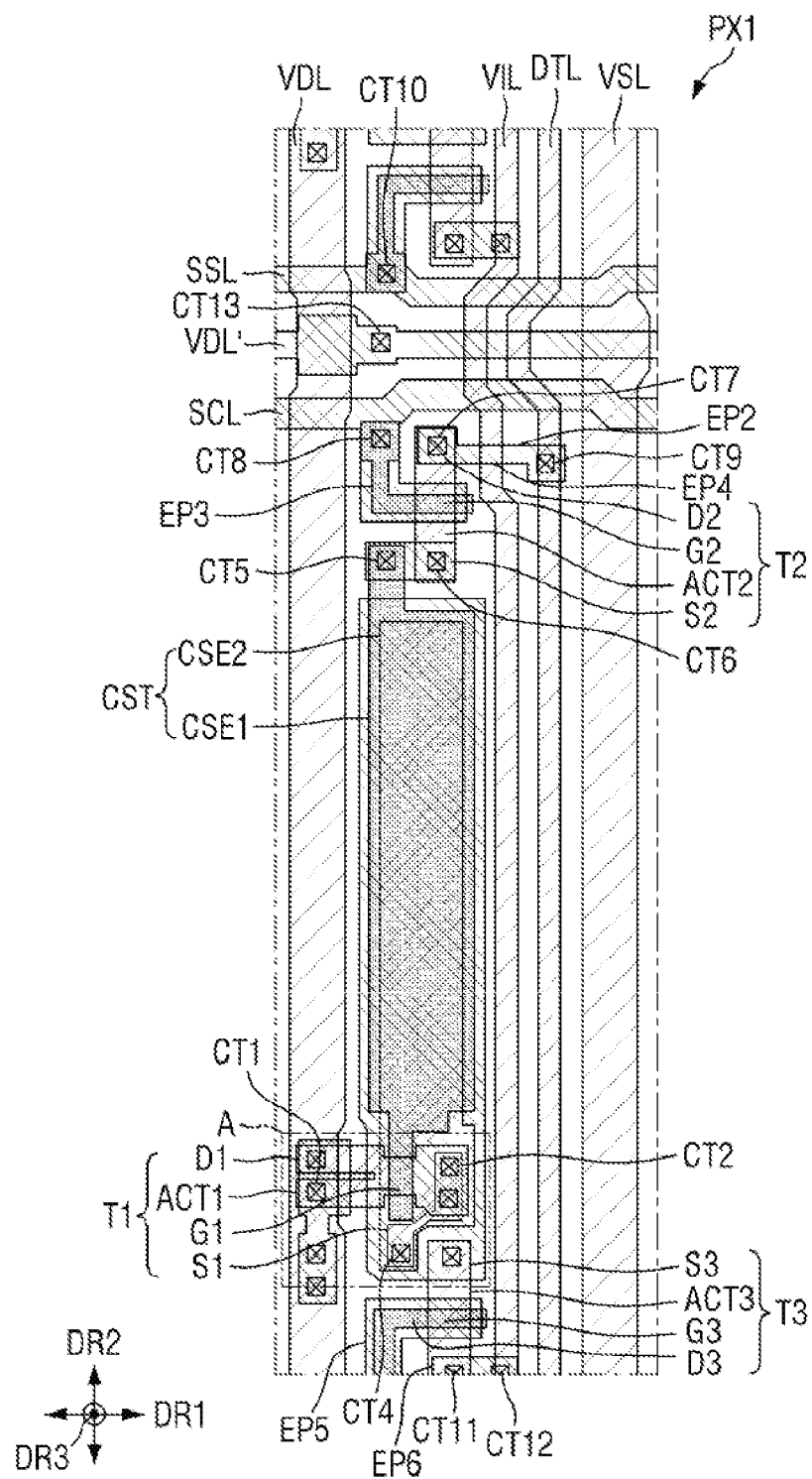
FIG. 5 is a layout view illustrating a plurality of conductive layers included in a subpixel of the display device according to one or more embodiments.

FIG. 4 is a layout view illustrating a plurality of conductive layers included in a subpixel PXn of the display device 10 according to one or more embodiments. FIG. 5 is a layout view illustrating a plurality of conductive layers included in a subpixel PXn of the display device 10 according to one or more embodiments. In FIG. 4, areas occupied by subpixels PXn are not shown separately, but circuit element layers connected to light emitting diodes located in the subpixels PXn are shown separately.

In each of the following drawings, both sides of the first direction DR1 may be referred to as a left side and a right side, respectively, and both sides of the second direction DR2 may be referred to as an upper side and a lower side, respectively.

Referring to FIGS. 4 and 5, each of a plurality of pixels PX of the display device 10 may include a plurality of subpixels PXn (where n is an integer of 1 to 3). For example, one pixel PX may include a first subpixel PX1, a second subpixel PX2, and a third subpixel PX3. The first subpixel PX1 may emit light of a first color, the second subpixel PX2 may emit light of a second color, and the third subpixel PX3 may emit light of a third color. The first color may be blue, the second color may be green, and the third color may be red. However, the present disclosure is not limited thereto, and the subpixels PXn may also emit light of the same color.

Each subpixel PXn of the display device 10 may include an emission area EMA and a non-emission area. The emission area EMA may be an area in which light emitting elements 30 (see FIG. 10) are located to emit light of a corresponding wavelength band, and the non-emission area may be an area in which the light emitting elements 30 are not located, and from which no light is output because light emitted from the light emitting elements 30 does not reach this area. The emission area may include an area in which the light emitting elements 30 are located, and an area which is adjacent to the light emitting elements 30 and from which light emitted from the light emitting elements 30 is output. However, the present disclosure is not limited thereto, and the emission area may also include an area from which light emitted from the light emitting elements 30 is output after being reflected or refracted by other members. A plurality of light emitting elements 30 may be located in each subpixel PXn, and an area where the light emitting elements 30 are located and an area adjacent to this area may form the emission area.

A plurality of wirings are located in each pixel PX and subpixel PXn of the display device 10. For example, the display device 10 may include a scan line SCL and a sensing line SSL extending in the first direction DR1. In addition, the display device 10 includes a data line DTL, an initialization voltage wiring VIL, a first voltage wiring VDL, and a second voltage wiring VSL extending in the second direction DR2.

The scan line SCL extends in the first direction DR1 across a plurality of subpixels PXn arranged in the first direction DR1. In addition, a plurality of scan lines SCL are spaced apart from each other in the second direction DR2 over the display area DPA (e.g., over an entirety of the display area DPA). The scan line SCL may be located above the center of each pixel PX or subpixel PXn. The scan line SCL may be electrically connected to the gate electrode of the second transistor T2, and may transmit a scan signal to the second transistor T2.

Similarly, the sensing line SSL extends in the first direction DR1 across a plurality of subpixels PXn arranged in the first direction DR1. In addition, a plurality of sensing lines SSL are spaced apart from each other in the second direction DR2 over the display area DPA (e.g., over the entire display area DPA). The sensing line SSL may be located above the center of each pixel PX or subpixel PXn. The sensing line SSL may be electrically connected to the gate electrode of the third transistor T3, and may transmit a sensing signal to the third transistor T3.

The scan line SCL and the sensing line SSL may be formed of a data conductive layer (or a third conductive layer) to be described later.

The data line DTL extends in the second direction DR2 across a plurality of subpixels PXn arranged in the second direction DR2. In addition, a plurality of data lines DTL are spaced apart from each other in the first direction DR1 over the display area DPA (e.g., over the entire display area DPA). The data line DTL may be located on a right side of each subpixel PXn. The data line DTL may be electrically connected to the drain electrode of the second transistor T2, and may transmit a data signal to the second transistor T2.

The initialization voltage wiring VIL extends in the second direction DR2 across a plurality of pixels PX arranged in the second direction DR2. In addition, a plurality of initialization voltage wirings VIL are spaced apart from each other in the first direction DR1 over the display area DPA (e.g., over the entire display area DPA). The initialization voltage wiring VIL may be located for every three subpixels PXn or for every pixel PX. In an example, the initialization voltage wiring VIL may be located on a left side of the data line DTL connected to any one subpixel PXn. The initialization voltage wiring VIL may be electrically connected to the drain electrode of the third transistor T3, and may apply an initialization voltage to the third transistor T3.

The data line DTL and the initialization voltage wiring VIL may be formed of a first conductive layer to be described later.

The first voltage wiring VDL and the second voltage wiring VSL may extend in the second direction DR2 across a plurality of subpixels PXn neighboring each other in the second direction DR2. In addition, a plurality of first voltage wirings VDL and a plurality of second voltage wirings VSL are spaced apart from each other in the first direction DR1 over the display area DPA (e.g., over the entire display area DPA). The first voltage wiring VDL and the second voltage wiring VSL may be located between a plurality of data lines DTL in plan view. The first voltage wiring VDL may be located on a left side of the center of each subpixel PXn, and the second voltage wiring VSL may be located on a right side of the center of each subpixel PXn.

The first voltage wiring VDL may be electrically connected to the drain electrode of the first transistor T1, and may apply the first power supply voltage to the first transistor T1. The second voltage wiring VSL may be electrically connected to the second electrode of the light emitting diode EL, and may apply the second power supply voltage to the light emitting element. The first voltage wiring VDL and the second voltage wiring VSL may be formed of the first conductive layer. The first voltage wiring VDL may be electrically connected to a first power wiring VDL extending along the first direction DR1. The first power wiring VDL may be formed of the data conductive layer (or the third conductive layer) as illustrated in FIG. 5.

Figure 6:
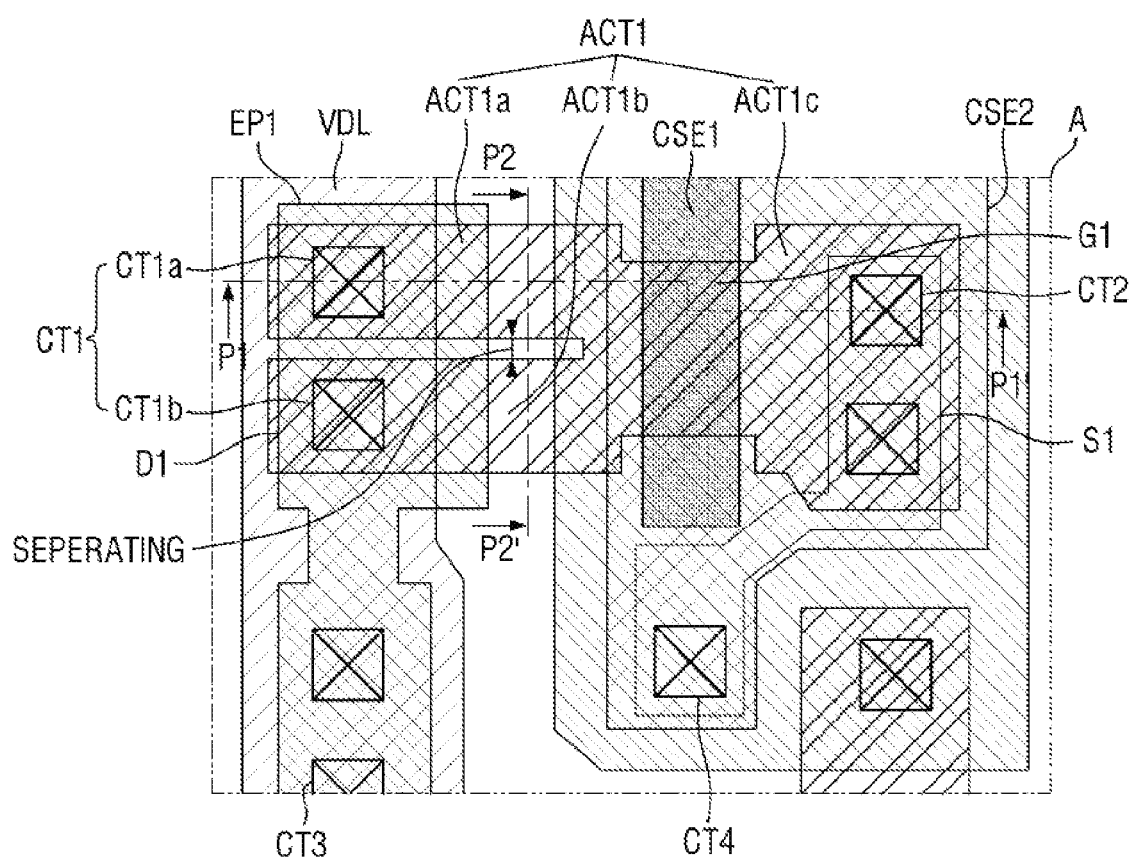
FIG. 6 is an enlarged plan view of area A of FIG. 5.
Figure 7:
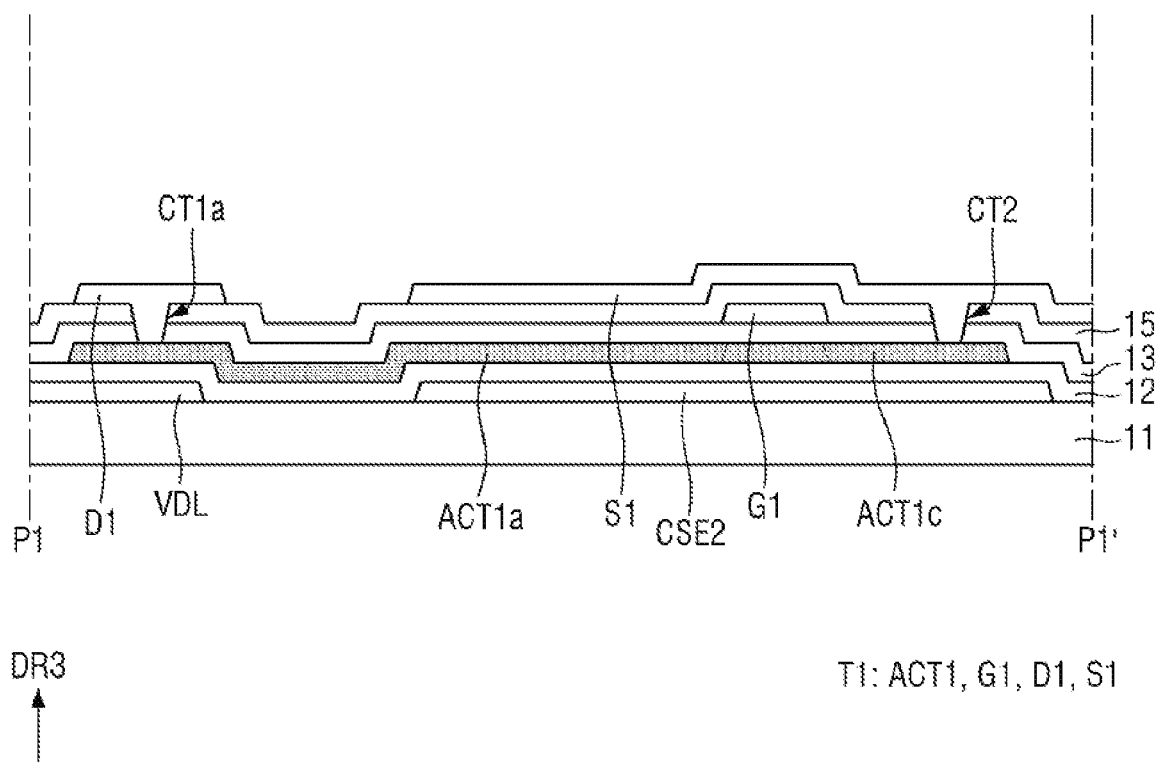
FIG. 7 is a cross-sectional view taken along the line P1-P1' of FIG. 6.
Figure 8:
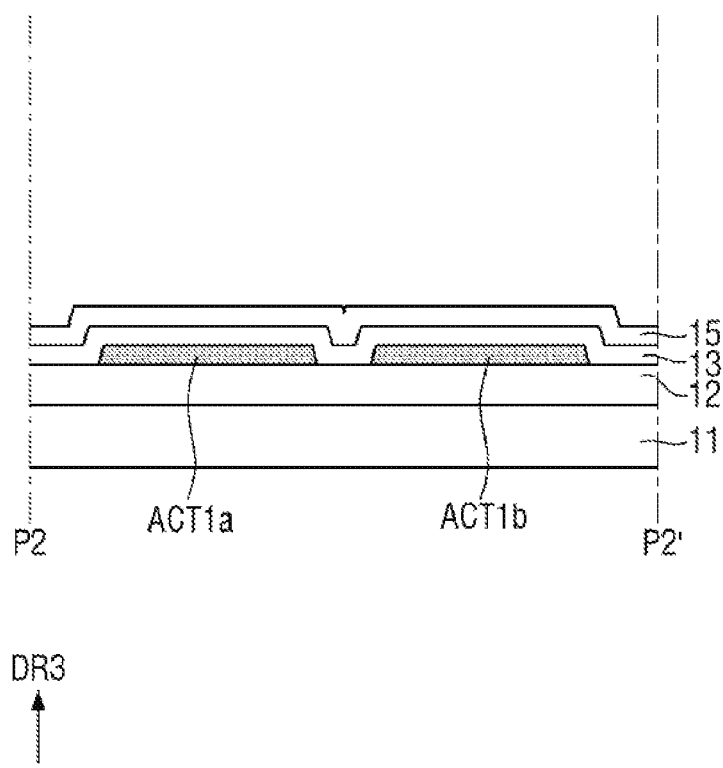
FIG. 8 is a cross-sectional view taken along the line P2-P2' of FIG. 6.
Figure 9:
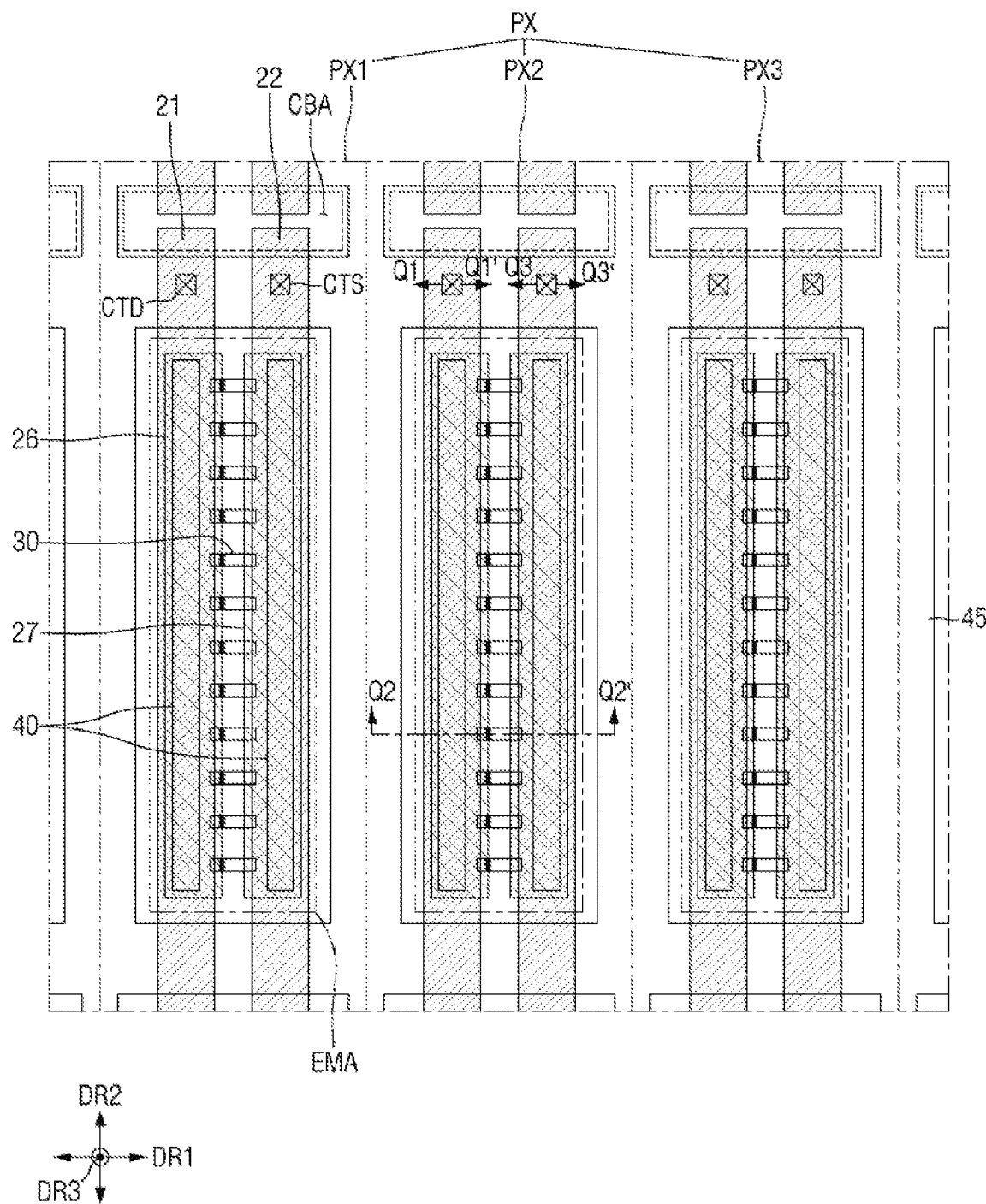
FIG. 9 is a schematic plan view illustrating a plurality of electrodes and banks included in a pixel of the display device according to one or more embodiments.
Figure 10:
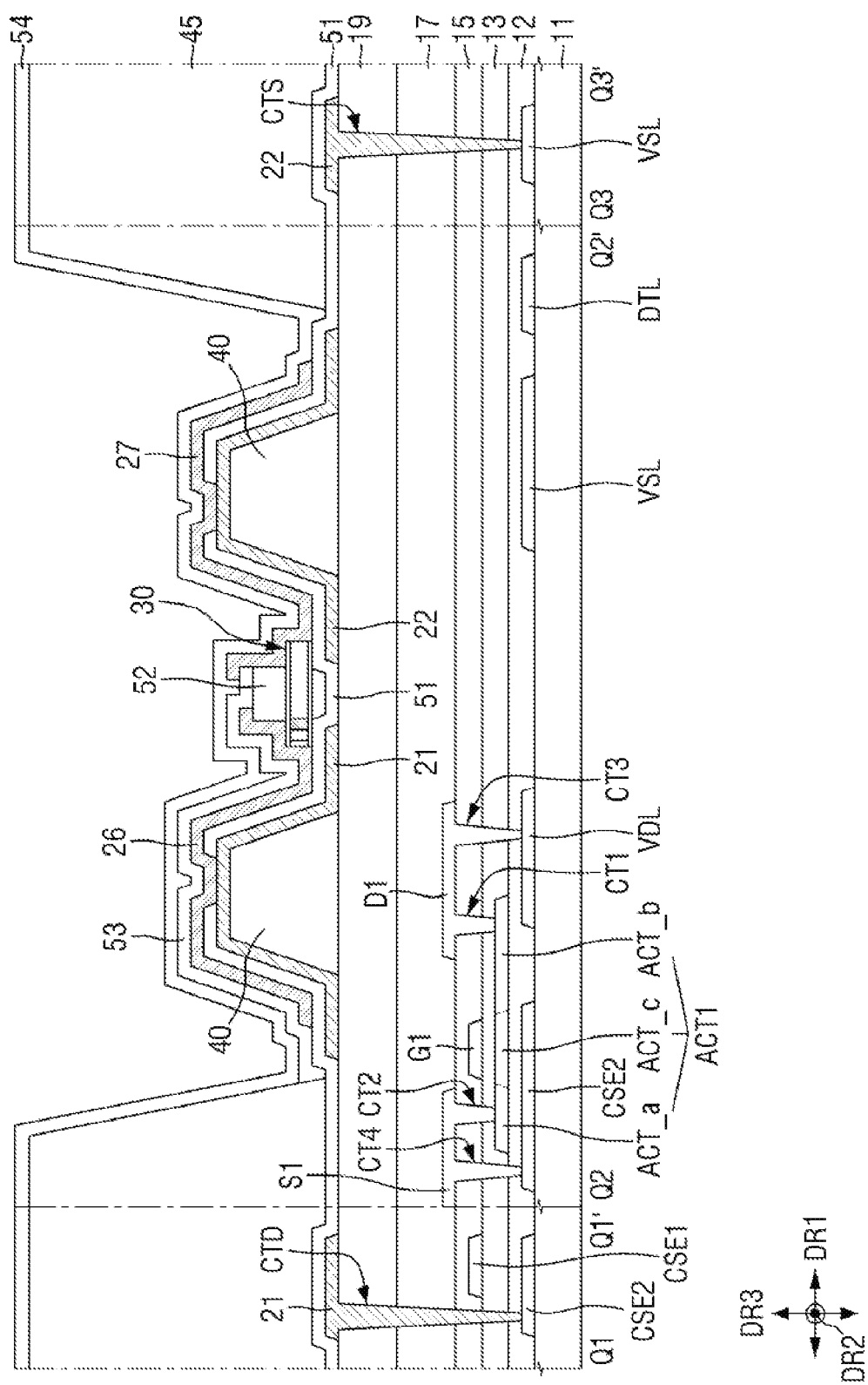
FIG. 10 is a cross-sectional view taken along the lines Q1-Q1', Q2-Q2', and Q3-Q3' of FIG. 9.

FIG. 6 is an enlarged plan view of area A of FIG. 5. FIG. 7 is a cross-sectional view taken along the line P1-P1' of FIG. 6. FIG. 8 is a cross-sectional view taken along the line P2-P2' of FIG. 6. FIG. 9 is a schematic plan view illustrating a plurality of electrodes and banks included in a pixel PX of the display device 10 according to one or more embodiments. FIG. 10 is a cross-sectional view taken along the lines Q1-Q1', Q2-Q2', and Q3-Q3' of FIG. 9. FIG. 9 illustrates a display element layer located in each pixel PX, that is, illustrates the arrangement of a plurality of banks 40 and 45 and a plurality of contact electrodes 26 and 27 in addition to electrodes 21 and 22 and light emitting elements 30 constituting each light emitting diode EL. FIG. 10 illustrates a cross section across both ends of a light emitting element 30 in addition to a first transistor T1.

Referring to FIGS. 6 through 10 in conjunction with FIGS. 4 and 5, the display device 10 may include a circuit element layer and the display element layer. The display element layer may be a layer in which a first electrode 21 and a second electrode 22 as well as the light emitting elements 30 of a light emitting diode EL are located, and the circuit element layer may be a layer in which a plurality of wirings as well as pixel circuit elements for driving the light emitting diode EL are located. For example, the circuit element layer may include transistors T1 through T3 in addition to a scan line SCL, a sensing line SSL, a data line DTL, an initialization voltage wiring VIL, a first voltage wiring VDL, and a second voltage wiring VSL.

In addition, each subpixel PXn may include a cut area CBA (see FIG. 9) located in the non-emission area. The cut area CBA may be located on a side of the emission area EMA in the second direction DR2. The cut area CBA may be located between the emission areas EMA of adjacent subpixels PXn neighboring each other in the second direction DR2. A plurality of emission areas EMA and a plurality of cut areas CBA may be arranged in the display area DPA of the display device 10. For example, the emission areas EMA and the cut areas CBA may be repeatedly arranged in the first direction DR1, but alternately arranged in the second direction DR2. In addition, a gap between the cut areas CBA in the first direction DR1 may be smaller than a gap between the emission areas EMA in the first direction DR1. As will be described later, a second bank 45 may be located between the cut areas CBA and the emission areas EMA. A gap between the cut areas CBA and the emission areas EMA may vary according to the width of the second bank 45. Light might not be output from the cut area CBA because the light emitting elements 30 are not located in the cut area CBA, but parts of the electrodes 21 and 22 located in each subpixel PXn may be located in the cut area CBA. The electrodes 21 and 22 located in each subpixel PXn may be separated in the cut area CBA.

The second bank 45 may include parts extending in the first direction DR1 and the second direction DR2 to form a grid pattern over the display area DPA (e.g., over the entire display area DPA) in plan view. The second bank 45 may be located at the boundary of each subpixel PXn to separate neighboring subpixels PXn. In addition, the second bank 45 may surround the emission area EMA and the cut area CBA located in each subpixel PXn to separate them from each other. Of a part of the second bank 45 that extends in the second direction DR2, a segment located between the emission areas EMA may have a greater width than a segment located between the cut areas CBA. Accordingly, the gap between the cut areas CBA may be smaller than the gap between the emission areas EMA.

The display device 10 includes a first substrate 11 on which the circuit element layer and the display element layer are located. The first substrate 11 may be an insulating substrate and may be made of an insulating material, such as glass, quartz, or polymer resin. In addition, the first substrate 11 may be a rigid substrate, but may also be a flexible substrate that can be bent, folded, rolled, and the like.

The first conductive layer may be located on the first substrate 11. The first conductive layer is overlapped by a first active layer ACT1 of the first transistor T1 of the display device 10. The first conductive layer may include a light blocking material to reduce or prevent light from entering the first active layer ACT1 of the first transistor T1. In an example, the first conductive layer may be made of an opaque metal material that blocks transmission of light. For example, the first conductive layer may include one or at least two of the opaque metal materials. For example, the first conductive layer may be provided in the form of a stacked layer of titanium (Ti) and copper (Cu). As shown in FIG. 10, the first conductive layer may include a second capacitive electrode CSE2, the first voltage wiring VDL, the second voltage wiring VSL, and the data line DTL.

The first conductive layer may have a first thickness. The thickness of the first conductive layer may be, but is not limited to, about 7000 Å to about 9000 Å. For example, the thickness of the first conductive layer may be about 8200 Å.

As described above, the first conductive layer may be applied as signal wirings of a pixel, such as the first voltage wiring VDL, the second voltage wiring VSL, and the data line DTL. The resistance of each signal wiring may be reduced so that the signal wiring can be applied. The resistance of each signal wiring is desirable when the material of the signal wiring includes a low-resistance material and when the thickness of the first conductive layer including the signal wiring is large. Because the thickness of the first conductive layer described above is applied in the range of about 7000 Å to about 9000 Å, the overall resistance of the first conductive layer applied as the signal wirings of the pixel can be reduced.

A buffer layer 12 may be entirely located on the first substrate 11 as well as the first conductive layer. The buffer layer 12 may be formed on the first substrate 11 to protect each of the transistors T1 through T3 from moisture introduced through the first substrate 11, which is vulnerable to moisture penetration, and may perform a surface planarization function. The buffer layer 12 may be composed of a plurality of inorganic layers stacked alternately. For example, the buffer layer 12 may be a multilayer in which inorganic layers including at least any one of silicon oxide ($SiO_x$), silicon nitride ($SiN_x$), and silicon oxynitride (SiON) are alternately stacked. The buffer layer 12 may conformally reflect a step difference of the first conductive layer located under the buffer layer 12.

A semiconductor layer is located on the buffer layer 12. The semiconductor layer may include respective active layers ACT1 through ACT3 of the transistors T1 through T3.

In one or more embodiments, the semiconductor layer may include polycrystalline silicon, monocrystalline silicon, an oxide semiconductor, or the like. The polycrystalline silicon may be formed by crystallizing amorphous silicon. When the semiconductor layer includes an oxide semiconductor, each of the active layers ACT1 through ACT3 may include a plurality of conducting regions ACTa and ACTb, and a channel region ACTc located between the conducting regions ACTa and ACTb. The oxide semiconductor may be an oxide semiconductor containing indium (In). In some embodiments, the oxide semiconductor may be indium tin oxide (ITO), indium zinc oxide (IZO), indium gallium oxide (IGO), indium zinc tin oxide (IZTO), indium gallium zinc oxide (IGZO), indium gallium tin oxide (IGTO), or indium gallium zinc tin oxide (IGZTO).

In one or more embodiments, the semiconductor layer may include polycrystalline silicon. The polycrystalline silicon may be formed by crystallizing amorphous silicon. In this case, each of the conducting regions ACTa and ACTb of the active layers ACT1 through ACT3 may be, but is not limited to, a doping region doped with impurities.

The semiconductor layer located on the buffer layer 12, which conformally reflects (e.g., has a shape that conforms to) the step difference of the first conductive layer, may also conformally reflect the step difference of the first conductive layer. The semiconductor layer may have a thickness of about 400 Å. That is, the thickness of the semiconductor layer may be about ½0th of the thickness of the first conductive layer described above. In addition, because the semiconductor layer conformally reflects the step difference of the first conductive layer, the semiconductor layer may be opened in a corresponding area due to the step difference of the first conductive layer, as will be described later.

A first gate insulating layer 13 may be located on the semiconductor layer and the buffer layer 12. The first gate insulating layer 13 may function as a gate insulating film of each transistor. The first gate insulating layer 13 may be an inorganic layer including an inorganic material, such as silicon oxide (SiOx), silicon nitride (SiNx), or silicon oxynitride (SiON), or may have a structure in which the above materials are stacked.

A first gate conductive layer (or a second conductive layer) is located on the first gate insulating layer 13. The first gate conductive layer may include respective gate electrodes G1 through G3 of the transistors T1 through T3, and may include a first capacitive electrode CSE1 of a storage capacitor.

The gate electrodes G1 through G3 of the first gate conductive layer may partially overlap the active layers of the transistors T1 through T3, respectively. For example, a first gate electrode G1 of the first transistor T1 may partially overlap the first active layer ACT1. The first gate electrode G1 may be integrally connected to the first capacitive electrode CSE1 of the storage capacitor.

A second gate electrode G2 of a second transistor T2 partially overlaps a second active layer ACT2, and a third gate electrode G3 of a third transistor T3 partially overlaps a third active layer ACT3.

The second gate electrode G2 may be electrically connected to the scan line SCL, and a scan signal may be transmitted to the second transistor T2. The third gate electrode G3 may be electrically connected to the sensing line SSL, and a sensing signal may be transmitted to the gate electrode G3 of the third transistor T3.

The first capacitive electrode CSE1 may be electrically connected to the first gate electrode G1 of the first transistor T1 and to a source electrode of the second transistor T2. For example, the first capacitive electrode CSE1 may be integrally formed with the first gate electrode G1, and may be connected to the source electrode of the second transistor T2 through a contact hole CT5.

In some embodiments, the first gate conductive layer may further include a third electrode pattern EP3. The third electrode pattern EP3 may overlap an area branching from the scan line SCL in the second direction DR2. The third electrode pattern EP3 may form the gate electrode G2 of the second transistor T2, and may be connected to the scan line SCL through a contact hole CT8. The first gate conductive layer may further include a fifth electrode pattern EP5 overlapping an area that branches from the sensing line SSL in the second direction DR2. The fifth electrode pattern EP5 may form the gate electrode G3 of the third transistor T3, and may be connected to the sensing line SSL through a contact hole CT10.

The first gate conductive layer may be, but is not limited to, a single layer or a multilayer made of any one or more of molybdenum (Mo), aluminum (Al), chromium (Cr), gold (Au), titanium (Ti), nickel (Ni), neodymium (Nd), copper (Cu), and alloys of the same.

A first protective layer 15 is located on the first gate conductive layer. The first protective layer 15 may protect the first gate conductive layer by covering the first gate conductive layer. The first protective layer 15 may be an inorganic layer including an inorganic material, such as silicon oxide ($SiO_x$), silicon nitride ($SiN_x$) or silicon oxynitride (SiON), or may have a structure in which the above materials are stacked.

The data conductive layer (or the third conductive layer) is located on the first protective layer 15. The first data conductive layer may include source electrodes and drain electrodes of the transistors T1 through T3 and a plurality of electrode patterns EP1 through EP6.

A first source electrode S1 and a first drain electrode D1 of the first transistor T1 partially overlap the first active layer ACT1. A first electrode pattern EP1 may include the first drain electrode D1. The first source electrode S1 and the first drain electrode D1 may contact the first active layer ACT1 respectively through contact holes CT2 and CT1 penetrating the first protective layer 15 and the first gate insulating layer 13.

The first drain electrode D1 may be electrically connected to the first voltage wiring VDL through a contact hole CT3, as shown in FIG. 6, and the first source electrode S1 may be connected to the second capacitive electrode CSE2 of the storage capacitor, which is connected to the first electrode 21 of the light emitting diode EL, through a contact hole CT4.

The first transistor T1 may be turned on by a data signal received from the second transistor T2 to transmit the first power supply voltage to the first electrode 21.

A second source electrode S2 and a second drain electrode D2 of the second transistor T2 partially overlap the second active layer ACT2. The second source electrode S2 and the second drain electrode D2 may contact the second active layer ACT2 respectively through contact holes CT6 and CT7 penetrating the first protective layer 15 and the first gate insulating layer 13.

The second drain electrode D2 may be connected to the data line DTL through a second electrode pattern EP2 (e.g., via the contact hole CT7), and the second source electrode S2 may contact the first capacitive electrode CSE1 through the contact hole CT5 penetrating the first protective layer 15. The second transistor T2 may be turned on by a scan signal to transmit a data signal received from the data line DTL to the first gate electrode G1 of the first transistor T1.

A third source electrode S3 and a third drain electrode D3 of the third transistor T3 partially overlap the third active layer ACT3. The third source electrode S3 and the third drain electrode D3 may respectively contact the third active layer ACT3 through contact holes CT11 and CT12 through penetrating the first protective layer 15 and the first gate insulating layer 13. The third source electrode S3 may be connected to the second capacitive electrode CSE2 of the storage capacitor. In addition, the third drain electrode D3 may be connected to the initialization voltage wiring VIL through a sixth electrode pattern EP6 (e.g., via the contact hole CT12).

The third transistor T3 may be turned on by a sensing signal to transmit an initialization voltage to the first electrode 21 of the light emitting diode EL along with the second capacitive electrode CSE2.

The second capacitive electrode CSE2 of the storage capacitor Cst overlaps the first capacitive electrode CSE1. In addition, the second capacitive electrode CSE2 may be electrically connected to the first electrode 21 of the light emitting diode EL through an electrode contact hole CTD penetrating insulating layers located thereon, as shown in FIG. 10.

The first data conductive layer (or the third conductive layer) may be, but is not limited to, a single layer or a multilayer made of any one or more of molybdenum (Mo), aluminum (Al), chromium (Cr), gold (Au), titanium (Ti), nickel (Ni), neodymium (Nd), copper (Cu), and alloys of the same.

A first interlayer insulating layer 17 is located on the first data conductive layer. The first interlayer insulating layer 17 may function as an insulating film between the first data conductive layer and other layers located on the first data conductive layer. In addition, the first interlayer insulating layer 17 may protect the first data conductive layer by covering the first data conductive layer. The first interlayer insulating layer 17 may be an inorganic layer including an inorganic material such as silicon oxide ($SiO_x$), silicon nitride ($SiN_x$) or silicon oxynitride (SiON), or may have a structure in which the above materials are stacked.

A first planarization layer 19 is located on the first interlayer insulating layer 17. The first planarization layer 19 may include an organic insulating material, for example, an organic material such as polyimide (PI) and may perform a surface planarization function.

A plurality of first banks 40, a plurality of electrodes 21 and 22, the light emitting elements 30, the second bank 45, and a plurality of contact electrodes 26 and 27 are located on the first planarization layer 19. In addition, a plurality of insulating layers 51 through 54 may be further located on the first planarization layer 19.

The first banks 40 may be directly located on the first planarization layer 19. The first banks 40 may extend in the second direction DR2 in each subpixel PXn, but may be located within the emission area EMA without extending to other subpixels PXn neighboring in the second direction DR2. In addition, the first banks 40 may be spaced apart from each other in the first direction DR1, and an area in which the light emitting elements 30 are located may be formed between respective ones of the first banks 40. The first banks 40 may be located in each subpixel PXn to extend along the second direction DR2 in the display area DPA of the display device 10. Although two first banks 40 are illustrated in the drawings for one emission area EMA, the present disclosure is not limited thereto. More first banks 40 may also be located depending on the number of electrodes 21 and 22 to be described later.

At least a part of each of the first banks 40 may protrude from an upper surface of the first planarization layer 19. The protruding part of each of the first banks 40 may have inclined side surfaces, and light emitted from the light emitting elements 30 may travel toward the inclined side surfaces of the first banks 40. The electrodes 21 and 22 located on the first banks 40 may include a material having high reflectivity, and light emitted from the light emitting elements 30 may be reflected by the electrodes 21 and 22 located on the first banks 40 to travel upwardly above the first planarization layer 19. That is, the first banks 40 may provide an area where the light emitting elements 30 are located while functioning as reflective barriers that reflect light emitted from the light emitting elements 30 in an upward direction. The side surfaces of the first banks 40 may be inclined in a linear shape. However, the present disclosure is not limited thereto, and the first banks 40 may also have a semicircular or semi-elliptical shape with a curved outer surface. In one or more embodiments, the first banks 40 may include, but are not limited to, an organic insulating material such as polyimide (PI).

The electrodes 21 and 22 are located on the first banks 40 and the first planarization layer 19. The electrodes 21 and 22 may include the first electrode 21 and the second electrode 22. The first electrode 21 and the second electrode 22 may extend in the second direction DR2, and may be spaced apart from each other in the first direction DR1.

The first electrode 21 and the second electrode 22 may extend in the second direction DR2 in each subpixel PXn, and may be separated from other, adjacent electrodes 21 and 22 with respect to the second direction DR2 in the cut area CBA. In some embodiments, the cut area CBA may be located between the emission areas EMA of adjacent subpixels PXn neighboring in the second direction DR2, and the first electrode 21 and the second electrode 22 may be separated in the cut area CBA from another first electrode 21 and another second electrode 22 located in another subpixel PXn neighboring in the second direction DR2. However, the present disclosure is not limited thereto. In other embodiments, some electrodes 21 and 22 might not be separated for each subpixel PXn, but instead may extend beyond the subpixels PXn neighboring in the second direction DR2. Also, in other embodiments, only one of the first electrode 21 and the second electrode 22 may be separated from a corresponding first electrode 21 or second electrode 22 in an adjacent subpixel PXn neighboring in the second direction DR2.

The first electrode 21 may be electrically connected to the first transistor T1 and the third transistor T3, and the second electrode 22 may be electrically connected to the second voltage wiring VSL.

For example, the first electrode 21 may contact the second capacitive electrode CSE2 through the first electrode contact hole CTD penetrating the first planarization layer 19, the first interlayer insulating layer 17, the first protective layer 15, the first gate insulating layer 13, and the buffer layer 12.

The second electrode 22 may be connected to the second voltage wiring VSL through a second electrode contact hole CT5 penetrating the first planarization layer 19, the first interlayer insulating layer 17, the first protective layer 15, the first gate insulating layer 13, and the buffer layer 12.

The first electrode 21 and the second electrode 22 may be located on respective ones of the first banks 40. In some embodiments, the first electrode 21 and the second electrode 22 may be formed to have greater widths than the first banks 40, respectively (e.g., in a plan view). For example, the first electrode 21 and the second electrode 22 may cover the outer surfaces of the first banks 40, respectively. The first electrode 21 and the second electrode 22 may be located on the side surfaces of the first banks 40, respectively, and a gap between the first electrode 21 and the second electrode 22 may be smaller than a gap between the first banks 40. In addition, at least a part of each of the first electrode 21 and the second electrode 22 may be directly located on the first planarization layer 19.

Each electrode 21 or 22 may include a conductive material having high reflectivity. For example, each electrode 21 or 22 may include a metal such as silver (Ag), copper (Cu) or aluminum (Al) as a material having high reflectivity, or may be an alloy including aluminum (Al), nickel (Ni) or lanthanum (La). Each electrode 21 or 22 may reflect light, which initially travels toward the side surfaces of the first banks 40 after being emitted from the light emitting elements 30, in the upward direction above each subpixel PXn.

However, the present disclosure is not limited thereto, and each electrode 21 or 22 may further include a transparent conductive material. For example, each electrode 21 or 22 may include a material such as indium tin oxide (ITO), indium zinc oxide (IZO), or indium tin zinc oxide (ITZO). In some embodiments, each electrode 21 or 22 may have a structure in which a transparent conductive material and a metal layer having high reflectivity are each stacked in one or more layers, or may be formed as a single layer including them. For example, each electrode 21 or 22 may have a stacked structure of ITO/Ag/ITO, ITO/Ag/IZO, or ITO/Ag/ITZO/IZO.

The electrodes 21 and 22 may be electrically connected to the light emitting elements 30, and a voltage (e.g., a predetermined voltage) may be applied to the electrodes 21 and 22 so that the light emitting elements 30 can emit light. For example, the electrodes 21 and 22 may be electrically connected to the light emitting elements 30 through the contact electrodes 26 and 27 to be described later, and an electrical signal transmitted to the electrodes 21 and 22 may be transmitted to the light emitting elements 30 through the contact electrodes 26 and 27.

In one or more embodiments, any one of the first electrode 21 and the second electrode 22 may be electrically connected to anodes of the light emitting elements 30, and the other one may be electrically connected to cathodes of the light emitting elements 30. However, the present disclosure is not limited thereto, and the opposite may also be the case.

In addition, the electrodes 21 and 22 may be utilized to form an electric field in each subpixel PXn so as to align the light emitting elements 30. The light emitting elements 30 may be placed between the first electrode 21 and the second electrode 22 by an electric field formed on the first electrode 21 and the second electrode 22. In one or more embodiments, the light emitting elements 30 of the display device 10 may be sprayed onto the electrodes 21 and 22 through an inkjet printing process. When ink containing the light emitting elements 30 is sprayed onto the electrodes 21 and 22, alignment signals are transmitted to the electrodes 21 and 22 to generate an electric field. The light emitting elements 30 dispersed in the ink may be aligned on the electrodes 21 and 22 by a dielectrophoretic force applied by the electric field generated on the electrodes 21 and 22.

A first insulating layer 51 is located on the first planarization layer 19, the first electrode 21, and the second electrode 22. The first insulating layer 51 covers an area between the first electrode 21 and the second electrode 22, and partially covers the first electrode 21 and the second electrode 22. For example, the first insulating layer 51 may cover most of upper surfaces of the first electrode 21 and the second electrode 22, but may partially expose the first electrode 21 and the second electrode 22. In other words, the first insulating layer 51 may be substantially entirely formed on the first planarization layer 19, but, in some embodiments, may include openings partially exposing the first electrode 21 and the second electrode 22.

In one or more embodiments, the first insulating layer 51 may be stepped such that a part of an upper surface of the first insulating layer 51 is depressed between the first electrode 21 and the second electrode 22. However, the present disclosure is not limited thereto. The first insulating layer 51 may form a flat upper surface so that the light emitting elements 30 are located thereon.

The first insulating layer 51 may protect the first electrode 21 and the second electrode 22 while insulating them from each other. In addition, the first insulating layer 51 may reduce or prevent the likelihood of the light emitting elements 30 located on the first insulating layer 51 directly contacting other members and thus being damaged. However, the shape and structure of the first insulating layer 51 are not limited thereto.

The second bank 45 may be located on the first insulating layer 51. The second bank 45 may include parts extending in the first direction DR1 and the second direction DR2 to form a lattice pattern over the display area DPA (e.g., over the entire display area DPA) in a plan view. The second bank 45 may be located at the boundary of each subpixel PXn to separate neighboring subpixels PXn. In addition, according to one or more embodiments, the second bank 45 may be formed to have a greater height than the first banks 40. The second bank 45 may reduce or prevent the likelihood of ink overflowing to adjacent subpixels PXn in an inkjet printing process during the manufacturing process of the display device 10. The second bank 45 may separate inks in which different light emitting elements 30 are dispersed for different subpixels PXn, so that the inks are not mixed with each other.

In addition, the second bank 45 may surround the emission area EMA and the cut area CBA located in each subpixel PXn to separate them from each other. The first electrode 21 and the second electrode 22 may extend in the second direction DR2 to cross a part of the second bank 45 that extends in the first direction DR1. Of a part of the second bank 45 that extends in the second direction DR2, a segment located between the emission areas EMA may have a greater width than a segment located between the cut areas CBA. Accordingly, the gap between the cut areas CBA may be smaller than the gap between the emission areas EMA. Like the first banks 40, the second bank 45 may include, but is not limited to, polyimide (PI).

The light emitting elements 30 may be located on the first insulating layer 51. The light emitting elements 30 may be spaced apart from each other along the second direction DR2 in which each electrode 21 or 22 extends, and may be aligned substantially parallel to each other. A gap between the light emitting elements 30 is not particularly limited. In addition, the light emitting elements 30 may extend in a direction, and the direction in which each electrode 21 or 22 extends and the direction in which the light emitting elements 30 extend may be substantially perpendicular to each other. However, the present disclosure is not limited thereto, and the light emitting elements 30 may also extend in a direction not perpendicular to, but instead oblique to, the direction in which each electrode 21 or 22 extends.

The light emitting elements 30 may include light emitting layers 36 (see FIG. 11) including different materials to emit light of different wavelength bands. The display device 10 may include the light emitting elements 30 for emitting light of different wavelength bands. Accordingly, light of the first color, light of the second color, and light of the third color may be output from the first subpixel PX1, the second subpixel PX2, and the third subpixel PX3, respectively. However, the present disclosure is not limited thereto. In some cases, the subpixels PXn may include the light emitting elements 30 of the same type to emit light of substantially the same color.

In addition, respective ends of each light emitting element 30, which are located between the first banks 40, may be located on the electrodes 21 and 22. For example, a first end of each light emitting element 30 may be located on the first electrode 21, and a second end may be located on the second electrode 22. A length by which each light emitting element 30 extends may be greater than the gap between the first electrode 21 and the second electrode 22, and both ends of each light emitting element 30 may be located on the first electrode 21 and the second electrode 22, respectively.

Each light emitting element 30 may include a plurality of layers having a width that is in a direction that is substantially perpendicular to an upper surface of the first substrate 11 or the first planarization layer 19. The direction in which each light emitting element 30 of the display device 10 extends may be parallel to the first planarization layer 19, and a plurality of semiconductor layers included in each light emitting element 30 may be sequentially located along the direction parallel to the upper surface of the first planarization layer 19. However, the present disclosure is not limited thereto. In some cases, when the light emitting elements 30 have a different structure, the layers may be located in a direction that is substantially perpendicular to the first planarization layer 19.

In addition, respective ends of each light emitting element 30 may contact the contact electrodes 26 and 27. According to some embodiments, an insulating film 38 might not be formed on end surfaces of each light emitting element 30 in the extending direction of the light emitting element 30 to partially expose the semiconductor layers. The exposed semiconductor layers may contact the contact electrodes 26 and 27. However, the present disclosure is not limited thereto. In some cases, at least a part of the insulating film 38 of each light emitting element 30 may be removed to partially expose side surfaces of the semiconductor layers at both ends. The exposed side surfaces of the semiconductor layers may directly contact the contact electrodes 26 and 27.

A second insulating layer 52 may be located on a part of each light emitting element 30. For example, the second insulating layer 52 may partially cover an outer surface of each light emitting element 30, but might not cover the first end and the second end of each light emitting element 30. The contact electrodes 26 and 27 to be described later may contact both ends of each light emitting element 30 not covered by the second insulating layer 52, respectively. A part of the second insulating layer 52 that is located on the light emitting elements 30 may extend in the second direction DR2 on the first insulating layer 51 to form a linear or island-shaped pattern in each subpixel PXn in plan view. The second insulating layer 52 may protect the light emitting elements 30 while fixing, or securing, the light emitting elements 30 during the manufacturing process of the display device 10.

The contact electrodes 26 and 27 and a third insulating layer 53 may be located on the second insulating layer 52.

The contact electrodes 26 and 27 may extend in a direction. A first contact electrode 26 and a second contact electrode 27 may be located on a part of the first electrode 21 and a part of the second electrode 22, respectively. The first contact electrode 26 may be located on the first electrode 21, the second contact electrode 27 may be located on the second electrode 22, and each of the first contact electrode 26 and the second contact electrode 27 may extend in the second direction DR2. The first contact electrode 26 and the second contact electrode 27 may be spaced apart from each other in the first direction DR1, and may form a stripe pattern in the emission area EMA of each subpixel PXn.

In some embodiments, widths of the first contact electrode 26 and the second contact electrode 27 measured in a direction may be respectively equal to or smaller than widths of the first electrode 21 and the second electrode 22 measured in the same direction. The first contact electrode 26 and the second contact electrode 27 may contact the first end and the second end of each light emitting element 30 while partially covering the upper surfaces of the first electrode 21 and the second electrode 22, respectively.

Each of the contact electrodes 26 and 27 may contact the light emitting elements 30 and a respective electrode 21 or 22. The semiconductor layers may be exposed on both end surfaces of each light emitting element 30 in the extending direction of the light emitting element 30, and the first contact electrode 26 and the second contact electrode 27 may directly contact each light emitting element 30 at respective end surfaces on which the semiconductor layers are exposed. The first ends of the light emitting elements 30 may be electrically connected to the first electrode 21 through the first contact electrode 26, and the second ends may be electrically connected to the second electrode 22 through the second contact electrode 27.

Although one first contact electrode 26 and one second contact electrode 27 are located in one subpixel PXn in the drawings, the present disclosure is not limited thereto. The number of first and second contact electrodes 26 and 27 may vary according to the number of first and second electrodes 21 and 22 located in each subpixel PXn.

The third insulating layer 53 is located on the first contact electrode 26. The third insulating layer 53 may electrically insulate the first contact electrode 26 and the second contact electrode 27 from each other. The third insulating layer 53 may cover the first contact electrode 26, but might not be located on (e.g., might not contact) the second ends of the light emitting elements 30 so that the light emitting elements 30 can contact the second contact electrode 27. The third insulating layer 53 may partially contact the first contact electrode 26 and the second insulating layer 52 on an upper surface of the second insulating layer 52. A side surface of the third insulating layer 53 in a direction in which the second electrode 22 is located may be aligned with a side surface of the second insulating layer 52. In addition, the third insulating layer 53 may be located in the non-emission area, for example, on (e.g., above) the first insulating layer 51 located on the first planarization layer 19. However, the present disclosure is not limited thereto.

The second contact electrode 27 is located on the second electrode 22, the second insulating layer 52, and the third insulating layer 53. The second contact electrode 27 may contact the second ends of the light emitting elements 30 and the exposed upper surface of the second electrode 22. The second ends of the light emitting elements 30 may be electrically connected to the second electrode 22 through the second contact electrode 27.

The second contact electrode 27 may partially contact the second insulating layer 52, the third insulating layer 53, the second electrode 22, and the light emitting elements 30. The first contact electrode 26 and the second contact electrode 27 might not contact each other due to the second insulating layer 52 and the third insulating layer 53. However, the present disclosure is not limited thereto. In some cases, the third insulating layer 53 may be omitted.

The contact electrodes 26 and 27 may include a conductive material such as ITO, IZO, ITZO, or aluminum (Al). For example, the contact electrodes 26 and 27 may include a transparent conductive material, and light emitted from the light emitting elements 30 may pass through the contact electrodes 26 and 27 and proceed toward the electrodes 21 and 22, but the present disclosure is not limited thereto.

A fourth insulating layer 54 may be entirely located on (e.g., above) the first substrate 11. The fourth insulating layer 54 may protect members located on the first substrate 11 from the external environment.

Each of the first insulating layer 51, the second insulating layer 52, the third insulating layer 53, and the fourth insulating layer 54 may include an inorganic insulating material or an organic insulating material. In one or more embodiments, each of the first insulating layer 51, the second insulating layer 52, the third insulating layer 53, and the fourth insulating layer 54 may include an inorganic insulating material such as silicon oxide ($SiO_x$), silicon nitride ($SiN_x$), silicon oxynitride ($SiO_xN_y$), aluminum oxide ($Al_2O_3$), or aluminum nitride (AlN). Alternatively, each of the first insulating layer 51, the second insulating layer 52, the third insulating layer 53, and the fourth insulating layer 54 may include an organic insulating material such as acrylic resin, epoxy resin, phenolic resin, polyamide resin, polyimide resin, unsaturated polyester resin, polyphenylene resin, polyphenylene sulfide resin, benzocyclobutene, cardo resin, siloxane resin, silsesquioxane resin, polymethyl methacrylate, polycarbonate, or polymethyl methacrylate-polycarbonate synthetic resin. However, the present disclosure is not limited thereto.

The first electrode 21 and the second electrode 22 may transmit a driving signal to the light emitting elements 30 during the driving of the display device 10 so that the light emitting elements 30 can emit light. During the driving of the display device 10, or in a driving mode, the first power supply voltage is transmitted to the first electrode 21 through the first transistor T1, and the second power supply voltage is transmitted to the second electrode 22 through the second voltage wiring VSL. In addition, a data signal may be transmitted to the first gate electrode G1 of the first transistor T1 through the second transistor T2, and an initialization voltage may be transmitted to the first source electrode S1 or the first electrode 21 through the third transistor T3.

As described above, the thickness of the semiconductor layer is about $1/20^{th}$ of the thickness of the first conductive layer described above, and the semiconductor layer conformally reflects (e.g., conforms to a shape of) the step difference of the first conductive layer. Therefore, the semiconductor layer may be opened in a corresponding area due to the step difference of the first conductive layer. The corresponding area may include a space between the first voltage wiring VDL of the first conductive layer and the second capacitive electrode CSE2, as illustrated in FIG. 6.

For example, referring to FIGS. 6 through 8, the first active layer ACT1 may have a branched structure in the space between the first voltage wiring VDL (or a first conductive pattern) and the second capacitive electrode CSE2 (or a second conductive pattern).

That is, the first active layer ACT1 may have a first branch part ACT1a and a second branch part ACT1b, which are spaced apart from each other in the second direction DR2 and which extend along the first direction DR1, and a stem part ACT1c, which is connected to the first branch part ACT1a and the second branch part ACT1b. Each of the first branch part ACT1a and the second branch part ACT1b may branch from the stem part ACT1c.

Each of the first branch part ACT1a and the second branch part ACT1b may overlap the space between the first voltage wiring VDL and the second capacitive electrode CSE2. Furthermore, each of the first branch part ACT1a and the second branch part ACT1b may extend from the first voltage wiring VDL to the second capacitive electrode CSE2. The gate electrode G1 of the first transistor T1 may overlap the stem part ACT1c, and the first drain electrode D1 of the first electrode pattern EP1 may overlap an end of the first branch part ACT1a, an end of the second branch part ACT1b, and a space between the first branch part ACT1 and the second branch part ACT1b.

The first electrode pattern EP1 may be electrically connected to the first branch part ACT1a through a (1a)th contact hole CT1a penetrating the first protective layer 15 and the first gate insulating layer 13. The first electrode pattern EP1 may be electrically connected to the second branch part ACT1b through a (1b)th contact hole CT1b penetrating the first protective layer 15 and the first gate insulating layer 13.

The first source electrode S1 may be electrically connected to the stem part ACT1c through a second contact hole CT2 penetrating the first protective layer 15 and the first gate insulating layer 13.

According to one or more embodiments, the first active layer ACT1 has branched structures in the space between the first voltage wiring VDL (or the first conductive pattern) and the second capacitive electrode CSE2 (or the second conductive pattern), and each of the branched structures ACT1a and ACT1b is electrically connected to the first drain electrode D1 of the first transistor T1. Therefore, even if any single part of the first active layer ACT1 (e.g., the first branch part ACT1a or the second branch part ACT1b) is opened, or separated, due to the step difference of the first conductive layer, electrical connection between the first active layer ACT1 and the first drain electrode D1 may remain possible, thus ensuring element reliability.

Figure 11:
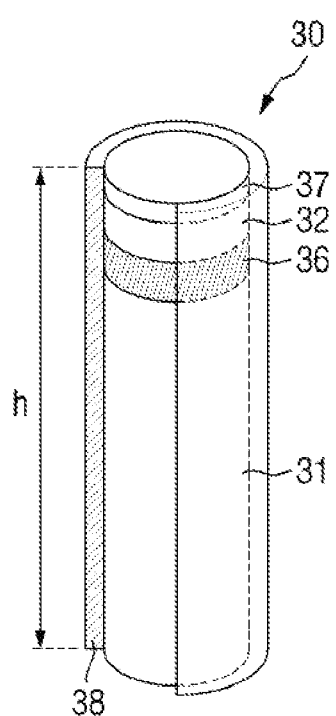
FIG. 11 is a schematic view of a light emitting element according to one or more embodiments.

FIG. 11 is a schematic view of a light emitting element 30 according to one or more embodiments.

The light emitting element 30 may be a light emitting diode. For example, the light emitting element 30 may be an inorganic light emitting diode having a size of micrometers or nanometers, and may be made of an inorganic material. When an electric field is formed in a corresponding direction between two electrodes facing each other, the inorganic light emitting diode may be aligned between the two electrodes in which polarities are formed. The light emitting element 30 may be aligned between the electrodes by the electric field formed on the two electrodes.

The light emitting element 30 according to one or more embodiments may extend in one direction. The light emitting element 30 may be shaped like a rod, a wire, a tube, or the like. In one or more embodiments, the light emitting element 30 may be shaped like a cylinder or a rod. However, the shape of the light emitting element 30 is not limited thereto, and the light emitting element 30 may also have various shapes, including polygonal prisms, such as a cube, a rectangular parallelepiped, and a hexagonal prism, and may include a shape extending in a direction and having a partially inclined outer surface. A plurality of semiconductors included in the light emitting element 30, which will be described later, may be sequentially located or stacked along the one direction.

The light emitting element 30 may include a semiconductor layer doped with impurities of any conductivity type (e.g., a p type or an n type). The semiconductor layer may receive an electrical signal from an external power source, and may emit light of a corresponding wavelength band.

Referring to FIG. 11, the light emitting element 30 may include a first semiconductor layer 31, a second semiconductor layer 32, a light emitting layer 36, an electrode layer 37, and the insulating film 38.

The first semiconductor layer 31 may be an n-type semiconductor. In an example, when the light emitting element 30 emits light in a blue wavelength band, the first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be any one or more of n-type doped AlGaInN, GaN, AlGaN, InGaN, AlN, and InN. The first semiconductor layer 31 may be doped with an n-type dopant, and the n-type dopant may be, for example, Si, Ge, or Sn. In one or more embodiments, the first semiconductor layer 31 may be n-GaN doped with n-type Si. A length of the first semiconductor layer 31 may be in the range of, but not limited to, about 1.5 μm to about 5 μm.

The second semiconductor layer 32 is located on the light emitting layer 36 to be described later. The second semiconductor layer 32 may be a p-type semiconductor. In an example, when the light emitting element 30 emits light in a blue or green wavelength band, the second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$), for example, may be any one or more of p-type doped AlGaInN, GaN, AlGaN, InGaN, AlN, and InN. The second semiconductor layer 32 may be doped with a p-type dopant, and the p-type dopant may be, for example, Mg, Zn, Ca, Sr, or Ba. In one or more embodiments, the second semiconductor layer 32 may be p-GaN doped with p-type Mg. A length of the second semiconductor layer 32 may be in the range of, but not limited to, about 0.05 μm to about 0.10 μm.

Although each of the first semiconductor layer 31 and the second semiconductor layer 32 is composed of one layer in the drawing, the present disclosure is not limited thereto. According to some embodiments, each of the first semiconductor layer 31 and the second semiconductor layer 32 may include more layers, for example, may further include a clad layer or a tensile strain barrier reducing (TSBR) layer depending on the material of the light emitting layer 36.

The light emitting layer 36 is located between the first semiconductor layer 31 and the second semiconductor layer 32. The light emitting layer 36 may include a material having a single or multiple quantum well structure. When the light emitting layer 36 includes a material having a multiple quantum well structure, it may have a structure in which a plurality of quantum layers and a plurality of well layers are alternately stacked. The light emitting layer 36 may emit light through combination of electron-hole pairs according to an electrical signal received through the first semiconductor layer 31 and the second semiconductor layer 32. For example, when the light emitting layer 36 emits light in the blue wavelength band, it may include a material such as AlGaN or AlGaInN. For example, when the light emitting layer 36 has a multiple quantum well structure in which a quantum layer and a well layer are alternately stacked, the quantum layer may include a material such as AlGaN or AlGaInN, and the well layer may include a material such as GaN or AlInN. In one or more embodiments, the light emitting layer 36 may include AlGaInN as a quantum layer and AlInN as a well layer to emit blue light whose central wavelength band is in the range of about 450 nm to about 495 nm.

However, the present disclosure is not limited thereto, and the light emitting layer 36 may also have a structure in which a semiconductor material having a large band gap energy and a semiconductor material having a small band gap energy are alternately stacked, or may include different group 3 to 5 semiconductor materials depending on the wavelength band of light that it emits. Light emitted from the light emitting layer 36 is not limited to light in the blue wavelength band. In some cases, the light emitting layer 36 may emit light in a red or green wavelength band. A length of the light emitting layer 36 may be in the range of, but not limited to, about 0.05 μm to about 0.10 μm.

Light emitted from the light emitting layer 36 may be radiated not only to an outer surface of the light emitting element 30 in a longitudinal direction, but also to both side surfaces. The direction of light emitted from the light emitting layer 36 is not limited to one direction.

The electrode layer 37 may be an ohmic contact electrode. However, the present disclosure is not limited thereto, and the electrode layer 37 may also be a Schottky contact electrode. The light emitting element 30 may include at least one electrode layer 37. Although the light emitting element 30 includes one electrode layer 37 in FIG. 11, the present disclosure is not limited thereto. In some cases, the light emitting element 30 may include more electrode layers 37, or the electrode layer 37 may be omitted. The following description of the light emitting element 30 may apply equally even when the light emitting element 30 includes a different number of electrode layers 37 or further includes another structure.

When the light emitting element 30 is electrically connected to an electrode or a contact electrode in the display device 10 according to one or more embodiments, the electrode layer 37 may reduce the resistance between the light emitting element 30 and the electrode or the contact electrode. The electrode layer 37 may include a conductive metal. For example, the electrode layer 37 may include at least any one of aluminum (Al), titanium (Ti), indium (In), gold (Au), silver (Ag), indium tin oxide (ITO), indium zinc oxide (IZO), and indium tin zinc oxide (ITZO). In addition, the electrode layer 37 may include an n-type or p-type-doped semiconductor material. The electrode layer 37 may include the same material or different materials, but the present disclosure is not limited thereto.

The insulating film 38 surrounds outer surfaces of the semiconductor layers and the electrode layers described above. In one or more embodiments, the insulating film 38 may surround an outer surface of at least the light emitting layer 36, and may extend in the direction in which the light emitting element 30 extends. The insulating film 38 may protect the above members. For example, the insulating film 38 may surround side surfaces of the above members, but may expose both ends of the light emitting element 30 in the longitudinal direction.

In the drawing, the insulating film 38 extends in the longitudinal direction of the light emitting element 30 to cover from side surfaces of the first semiconductor layer 31 to side surfaces of the electrode layer 37. However, the present disclosure is not limited thereto, and the insulating film 38 may also cover outer surfaces of only some semiconductor layers as well as the light emitting layer 36, or may cover only a part of an outer surface of the electrode layer 37 to partially expose the outer surface of each electrode layer 37. Alternatively, an upper surface of the insulating film 38 may be rounded in cross section in an area adjacent to at least one end of the light emitting element 30.

A thickness of the insulating film 38 may be in the range of, but is not limited to, about 10 nm to about 1.0 μm. The thickness of the insulating film 38 may be, for example, about 40 nm.

The insulating film 38 may include a material having insulating properties, such as silicon oxide ($SiO_x$), silicon nitride ($SiN_x$), silicon oxynitride ($SiO_xN_y$), aluminum nitride (AlN), or aluminum oxide ($Al_2O_3$). Therefore, the insulating film 38 may reduce or prevent the likelihood of an electrical short circuit that otherwise may occur when the light emitting layer 36 directly contacts an electrode through which an electrical signal is transmitted to the light emitting element 30. In addition, the insulating film 38 may decrease or prevent a reduction in luminous efficiency by protecting the outer surface of the light emitting element 30 including the light emitting layer 36.

In addition, in some embodiments, an outer surface of the insulating film 38 may be treated. A plurality of light emitting elements 30 may be sprayed on electrodes in a state in which they are dispersed in an ink (e.g., a predetermined ink) and then may be aligned. Here, the surface of the insulating film 38 may be hydrophobic or hydrophilic-treated so that the light emitting element 30 remains separate from other adjacent light emitting elements 30 in the ink without being agglomerated with them.

A length h of the light emitting element 30 may be in the range of about 1 μm to about 10 μm or about 2 μm to about 6 μm, and may be, for example, in the range of about 3 μm to about 5 μm. In addition, a diameter of the light emitting element 30 may be in the range of about 30 μm to about 700 nm, and an aspect ratio of the light emitting element 30 may be about 1.2 to about 100. However, the present disclosure is not limited thereto, and a plurality of light emitting elements 30 included in the display device 10 may also have different diameters according to a difference in composition of the light emitting layer 36. The diameter of the light emitting element 30 may be, for example, about 500 nm.

Hereinafter, other embodiments will be described.

Figure 12:
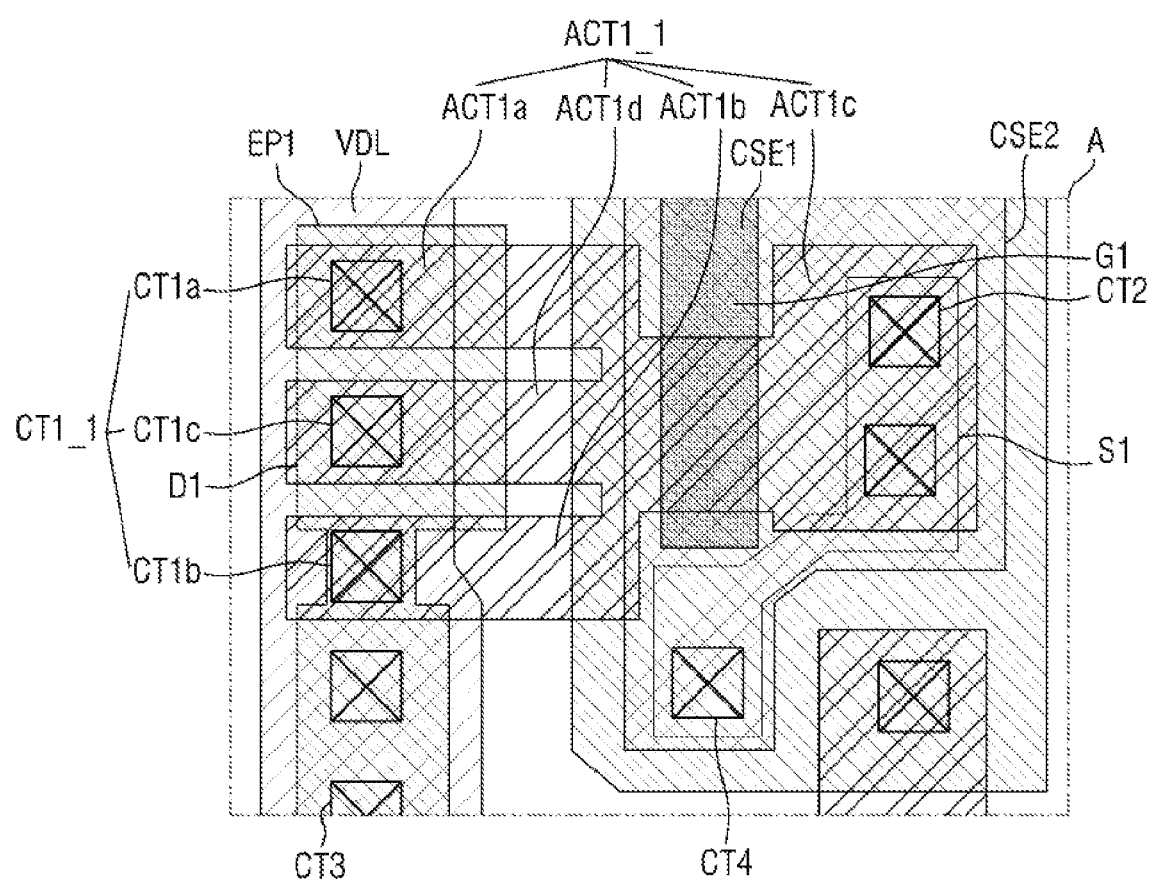
FIG. 12 is an enlarged plan view of area A of FIG. 5 according to one or more embodiments.

FIG. 12 is an enlarged plan view of area A of FIG. 5 according to one or more embodiments.

Referring to FIG. 12, a first active layer ACT1_1 of a display device according to one or more embodiments is different from the first active layer ACT1 of FIG. 6 in that it further includes a third branch part ACT1d.

The third branch part ACT1d may branch from a stem part ACT1c. The third branch part ACT1d may be located between a first branch part ACT1a and a second branch part ACT1b, but the present disclosure is not limited thereto. The third branch part ACT1d may be electrically connected to the first electrode pattern EP1 through a (1c)th contact hole CT1c penetrating the first protective layer 15 and the first gate insulating layer 13.

Even in the current example, the first active layer ACT1_1 has branched structures in the space between the first voltage wiring VDL (or the first conductive pattern) and the second capacitive electrode CSE2 (or the second conductive pattern), and each of the branched structures ACT1a, ACT1b, and ACT1d is electrically connected to the first drain electrode D1 of the first transistor T1. Therefore, even if any single part of the first active layer ACT1_1 (e.g., the first branch part ACT1a, the second branch part ACT1b, or the third branch part ACT1d) is opened, or disconnected, due to the step difference of the first conductive layer, electrical connection between the first active layer ACT1_1 and the first drain electrode D1 is possible, thus ensuring element reliability.

Figure 13:
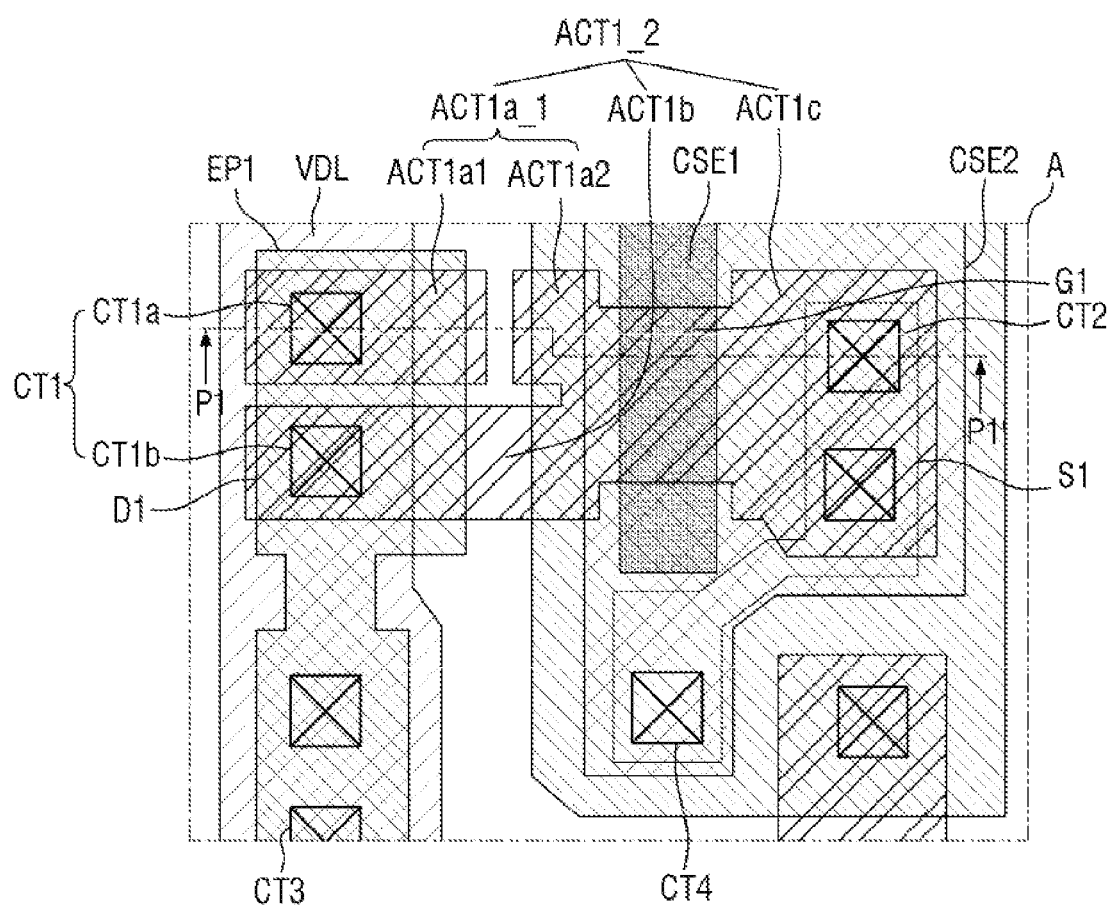
FIG. 13 is an enlarged plan view of area A of FIG. 5 according to one or more embodiments.
Figure 14:
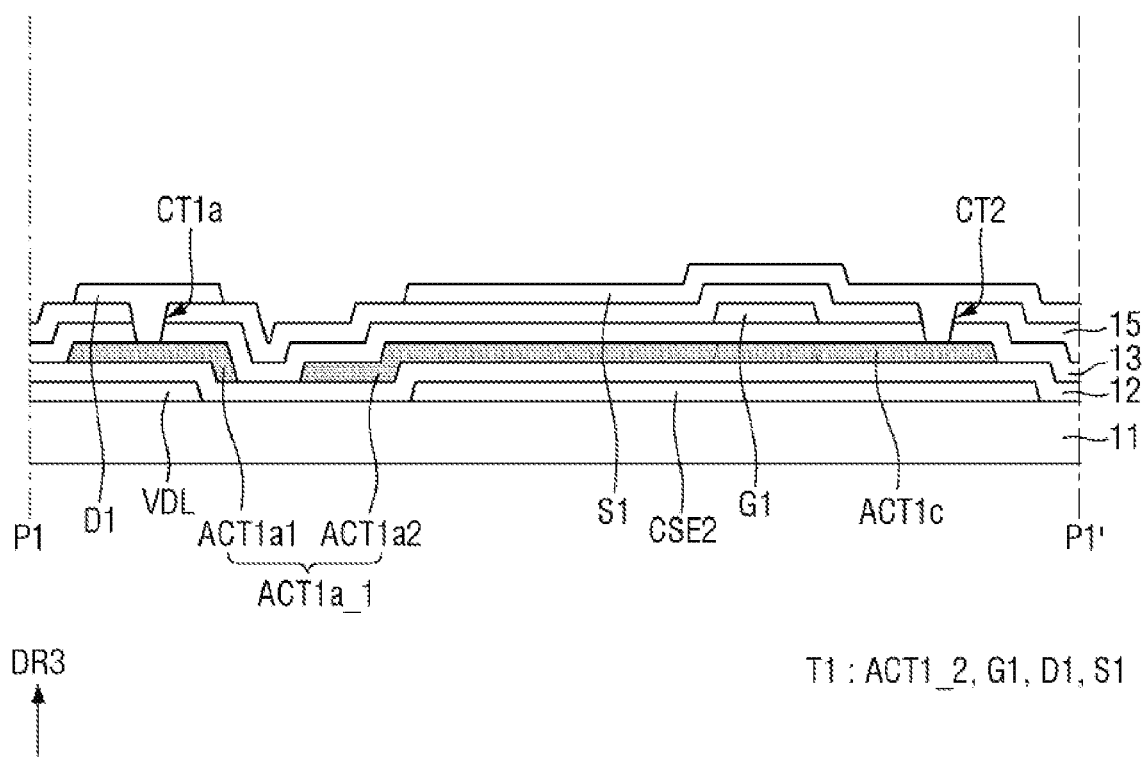
FIG. 14 is a cross-sectional view taken along the line P1-P1' of FIG. 13.

FIG. 13 is an enlarged plan view of area A of FIG. 5 according to one or more embodiments. FIG. 14 is a cross-sectional view taken along the line P1-P1' of FIG. 13.

Referring to FIGS. 13 and 14, a first active layer ACT1_2 of a display device according to one or more embodiments is different from the first active layer ACT1 of FIG. 6 in that any one of a first branch part and a second branch part includes physically separated branch patterns.

For example, any one of the first branch part and the second branch part of the first active layer ACT1_2 of the display device according to one or more embodiments may include physically separated branch patterns. In FIGS. 13 and 14, a case where the first branch part ACT1a_1 among the first branch part and the second branch part includes physically separated branch patterns is illustrated.

The first branch part ACT1a_1 may include physically separated branch patterns ACT1a1 and ACT1a2. A first branch pattern ACT1a1 may be connected to the first electrode pattern EP1 through a (1a)th contact hole CT1a, and a second branch pattern ACT1a2 may be connected to a stem part ACT1c. The branch patterns ACT1a1 and ACT1a2 may be physically separated from each other in the first direction DR1.

The first branch part ACT1a_1 according to one or more embodiments is opened due to the step difference of the first conductive layer. That is, in the display device according to one or more embodiments, even if the first branch part ACT1a_1 of the first active layer ACT1_2 is opened due to the step difference of the first conductive layer, because the second branch part ACT1b is integrally formed without being opened, electrical connection between the first active layer ACT1_2 and the first drain electrode D1 is possible, thus ensuring element reliability.

In a display device according to embodiments, the likelihood of a first active layer being opened due to a step difference under the first active layer can be reduced or prevented.

However, the effects of the present disclosure are not restricted to the one set forth herein. The above and other effects of the present disclosure will become more apparent to one of daily skill in the art to which the present disclosure pertains by referencing the claims.

Although embodiments of the present disclosure have been disclosed for illustrative purposes, those skilled in the art will appreciate that various modifications, additions and substitutions are possible, without departing from the scope and spirit of the present disclosure as disclosed in the accompanying claims, with functional equivalents thereof to be include therein.

What is claimed is:

1. A display device comprising:
   a substrate;
   a first active layer on the substrate and extending along a first direction; and
   a first conductive layer between the substrate and the first active layer, and comprising a first conductive pattern and a second conductive pattern spaced apart from each other in the first direction,
   wherein the first active layer conformally reflects a step difference of the first conductive layer, and comprises a branched structure in a space between the first conductive pattern and the second conductive pattern.

2. The display device of claim 1, wherein the first active layer comprises:

a first branch part and a second branch part spaced apart from each other in a second direction that crosses the first direction, and extending along the first direction; and a stem part connected to the first branch part and the second branch part.

3. The display device of claim 2, wherein the first branch part and the second branch part branch from the stem part.

4. The display device of claim 3, wherein the first branch part and the second branch part overlap the space between the first conductive pattern and the second conductive pattern.

5. The display device of claim 4, wherein the first branch part and the second branch part extend from the first conductive pattern to the second conductive pattern.

6. The display device of claim 5, wherein the first conductive pattern comprises a first voltage wiring, and
wherein the second conductive pattern comprises a lower capacitive electrode.

7. The display device of claim 6, further comprising a second conductive layer on the first active layer, and comprising a first gate electrode of a first transistor overlapping the stem part.

8. The display device of claim 7, further comprising a third conductive layer on the second conductive layer, the third conductive layer comprising:
an end of the first branch part;
an end of the second branch part;
a first electrode pattern overlapping a space between the first branch part and the second branch part; and
a second electrode pattern overlapping the stem part.

9. The display device of claim 8, wherein the first electrode pattern overlaps the first conductive pattern, and
wherein the second electrode pattern overlaps the second conductive pattern.

10. The display device of claim 9, further comprising:
a buffer layer between the first conductive layer and the first active layer;
a first gate insulating layer between the first active layer and the second conductive layer; and
a first protective layer between the second conductive layer and the third conductive layer.

11. The display device of claim 10, wherein the first electrode pattern is electrically connected to the first branch part through a (1a)-th contact hole penetrating the first protective layer and the first gate insulating layer, and is electrically connected to the second branch part through a (1b)-th contact hole penetrating the first protective layer and the first gate insulating layer.

12. The display device of claim 11, wherein the second electrode pattern is electrically connected to the stem part through a second contact hole penetrating the first protective layer and the first gate insulating layer.

13. The display device of claim 12, wherein the first electrode pattern comprises a first drain electrode of the first transistor, and
wherein the second electrode pattern comprises a first source electrode of the first transistor.

14. The display device of claim 1, wherein the first conductive layer has a thickness of about 7000 Å to about 9000 Å.

15. The display device of claim 14, wherein the first conductive layer comprises a stacked layer of titanium (Ti) and copper (Cu).

16. A display device comprising:
a substrate;
a first active layer on the substrate, and extending along a first direction; and
a first conductive layer between the substrate and the first active layer, and comprising a first conductive pattern and a second conductive pattern spaced apart from each other in the first direction,
wherein the first active layer conformally reflects a step difference of the first conductive layer, comprises a branched structure in a space between the first conductive pattern and the second conductive pattern, the branched structure comprising:
a first branch part and a second branch part spaced apart from each other in a second direction crossing the first direction and extending along the first direction; and
a stem part connected to the first branch part and the second branch part,
wherein the first branch part and the second branch part branch from the stem part, and
wherein any one of the first branch part and the second branch part comprises physically separated branch patterns.

17. The display device of claim 16, wherein the first branch part and the second branch part overlap the space between the first conductive pattern and the second conductive pattern.

18. The display device of claim 17, wherein the first branch part and the second branch part extend from the first conductive pattern to the second conductive pattern.

19. The display device of claim 16, wherein the first conductive layer has a thickness of 7000 to 9000 Å.

20. The display device of claim 19, wherein the first conductive layer comprises a stacked layer of titanium (Ti) and copper (Cu).

* * * * *